(12) United States Patent
Haukka et al.

(10) Patent No.: US 10,456,808 B2
(45) Date of Patent: *Oct. 29, 2019

(54) SELECTIVE DEPOSITION OF METALS, METAL OXIDES, AND DIELECTRICS

(71) Applicant: ASM IP Holding B.V., Almere (NL)

(72) Inventors: Suvi P. Haukka, Helsinki (FI); Raija H. Matero, Helsinki (FI); Eva Tois, Helsinki (FI); Antti Niskanen, Helsinki (FI); Marko Tuominen, Helsinki (FI); Hannu Huotari, Helsinki (FI); Viljami J. Pore, Helsinki (FI); Ivo Raaijmakers, Bilthoven (NL)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/877,632

(22) Filed: Jan. 23, 2018

(65) Prior Publication Data

US 2018/0243787 A1  Aug. 30, 2018

Related U.S. Application Data

(63) Continuation of application No. 14/612,784, filed on Feb. 3, 2015, now Pat. No. 9,895,715.

(Continued)

(51) Int. Cl.
*C23C 16/40* (2006.01)
*B05D 3/10* (2006.01)
(Continued)

(52) U.S. Cl.
CPC .............. *B05D 3/107* (2013.01); *C23C 16/02* (2013.01); *C23C 16/045* (2013.01); *C23C 16/14* (2013.01);
(Continued)

(58) Field of Classification Search
CPC .. C23C 16/40; C23C 16/402; C23C 16/45525
See application file for complete search history.

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Hashemi, Fatemeh Sadat Minaye, et al., "Selective Deposition of Dielectrics: Limits and Advantages of Alkanethiol Blocking Agents on Metal-Dielectric Patterns". Applied Materials & Interfaces, 2016, 8, 33264-33272.*

(Continued)

*Primary Examiner* — Bret P Chen
(74) *Attorney, Agent, or Firm* — Knobbe, Martens, Olson & Bear, LLP

(57) ABSTRACT

Methods are provided for selectively depositing a material on a first surface of a substrate relative to a second, different surface of the substrate. The selectively deposited material can be, for example, a metal, metal oxide, or dielectric material.

20 Claims, 8 Drawing Sheets

Related U.S. Application Data

(60) Provisional application No. 61/935,798, filed on Feb. 4, 2014.

(51) Int. Cl.

| | | |
|---|---|---|
| *C23C 18/06* | (2006.01) | |
| *C23C 18/12* | (2006.01) | |
| *C23C 16/02* | (2006.01) | |
| *C23C 16/04* | (2006.01) | |
| *C23C 16/14* | (2006.01) | |
| *C23C 16/18* | (2006.01) | |
| *C23C 16/28* | (2006.01) | |

(52) U.S. Cl.
CPC ............. *C23C 16/18* (2013.01); *C23C 16/28* (2013.01); *C23C 16/40* (2013.01); *C23C 16/402* (2013.01); *C23C 16/403* (2013.01); *C23C 18/06* (2013.01); *C23C 18/122* (2013.01); *C23C 18/1208* (2013.01); *C23C 18/1212* (2013.01); *C23C 18/1216* (2013.01); *C23C 18/1225* (2013.01); *C23C 18/1245* (2013.01)

(56) References Cited

U.S. PATENT DOCUMENTS

| | | | |
|---|---|---|---|
| 4,948,755 A | 8/1990 | Mo | |
| 5,288,697 A | 2/1994 | Schrepp et al. | |
| 5,447,887 A | 9/1995 | Filipiak et al. | |
| 5,604,153 A | 2/1997 | Tsubouchi et al. | |
| 5,633,036 A | 5/1997 | Seebauer et al. | |
| 5,869,135 A | 2/1999 | Vaeth et al. | |
| 5,925,494 A | 7/1999 | Horn | |
| 6,046,108 A | 4/2000 | Liu et al. | |
| 6,482,740 B2 | 11/2002 | Soininen et al. | |
| 6,586,330 B1 | 7/2003 | Ludviksson et al. | |
| 6,679,951 B2 | 1/2004 | Soininen et al. | |
| 6,759,325 B2 | 7/2004 | Raaijmakers et al. | |
| 6,811,448 B1 | 11/2004 | Paton | |
| 6,844,258 B1 | 1/2005 | Fair et al. | |
| 6,878,628 B2 | 4/2005 | Sophie et al. | |
| 6,887,795 B2 | 5/2005 | Soininen et al. | |
| 6,921,712 B2 | 7/2005 | Soininen et al. | |
| 6,958,174 B1 | 10/2005 | Klaus et al. | |
| 7,067,407 B2 | 6/2006 | Kostamo et al. | |
| 7,084,060 B1 | 8/2006 | Furukawa et al. | |
| 7,118,779 B2 | 10/2006 | Verghese et al. | |
| 7,220,669 B2 | 5/2007 | Hujanen et al. | |
| 7,241,677 B2 | 7/2007 | Soininen et al. | |
| 7,323,411 B1 | 1/2008 | Blosse | |
| 7,405,143 B2 | 7/2008 | Leinikka et al. | |
| 7,425,350 B2 | 9/2008 | Todd | |
| 7,476,618 B2 | 1/2009 | Kilpela et al. | |
| 7,494,927 B2 | 2/2009 | Kostamo et al. | |
| 7,595,271 B2 | 9/2009 | White | |
| 7,754,621 B2 | 7/2010 | Putkonen | |
| 7,790,631 B2 * | 9/2010 | Sharma ................. H01L 21/022 438/780 |
| 7,799,135 B2 | 9/2010 | Verghese et al. | |
| 7,910,177 B2 | 3/2011 | Li | |
| 7,914,847 B2 | 3/2011 | Verghese et al. | |
| 7,927,942 B2 | 4/2011 | Raaijmakers | |
| 7,955,979 B2 | 6/2011 | Kostamo et al. | |
| 7,964,505 B2 | 6/2011 | Khandelwal et al. | |
| 8,293,597 B2 | 10/2012 | Raaijmakers | |
| 8,293,658 B2 | 10/2012 | Shero et al. | |
| 8,425,739 B1 | 4/2013 | Wieting | |
| 8,536,058 B2 | 9/2013 | Kostamo et al. | |
| 8,778,815 B2 | 7/2014 | Yamaguchi et al. | |
| 8,890,264 B2 | 11/2014 | Dewey et al. | |
| 8,956,971 B2 | 2/2015 | Haukka et al. | |
| 8,962,482 B2 | 2/2015 | Albertson et al. | |
| 8,980,418 B2 | 3/2015 | Darling et al. | |
| 8,993,404 B2 | 3/2015 | Kobrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,136,110 B2 | 9/2015 | Rathsack | |
| 9,159,558 B2 | 10/2015 | Cheng et al. | |
| 9,236,292 B2 | 1/2016 | Romero et al. | |
| 9,257,303 B2 | 2/2016 | Haukka et al. | |
| 9,349,687 B1 * | 5/2016 | Gates ................. H01L 23/53223 |
| 9,490,145 B2 | 11/2016 | Niskanen et al. | |
| 9,502,289 B2 | 11/2016 | Haukka et al. | |
| 9,803,277 B1 | 10/2017 | Longrie et al. | |
| 9,895,715 B2 * | 2/2018 | Haukka ................. B05D 3/107 |
| 9,911,595 B1 | 3/2018 | Smith et al. | |
| 10,041,166 B2 | 8/2018 | Longrie et al. | |
| 2001/0019803 A1 | 9/2001 | Mirkanimi | |
| 2001/0025205 A1 | 9/2001 | Chern et al. | |
| 2002/0027261 A1 | 3/2002 | Blesser et al. | |
| 2002/0047144 A1 | 4/2002 | Nguyen et al. | |
| 2002/0068458 A1 | 6/2002 | Chiang et al. | |
| 2002/0090777 A1 | 7/2002 | Forbes et al. | |
| 2002/0107316 A1 | 8/2002 | Bice et al. | |
| 2003/0027431 A1 | 2/2003 | Sneh et al. | |
| 2003/0066487 A1 | 4/2003 | Suzuki | |
| 2003/0143839 A1 | 7/2003 | Raaijmakers et al. | |
| 2003/0181035 A1 | 9/2003 | Yoon et al. | |
| 2003/0192090 P1 | 10/2003 | Meilland | |
| 2003/0193090 A1 | 10/2003 | Otani et al. | |
| 2004/0092073 A1 | 5/2004 | Cabral | |
| 2004/0219746 A1 | 7/2004 | Vaartstra et al. | |
| 2005/0012975 A1 | 1/2005 | George et al. | |
| 2005/0136604 A1 | 6/2005 | Al-Bayati et al. | |
| 2005/0223989 A1 | 10/2005 | Lee et al. | |
| 2006/0019493 A1 | 1/2006 | Li | |
| 2006/0047132 A1 | 3/2006 | Shenai-Khatkhate et al. | |
| 2006/0121271 A1 | 6/2006 | Frey et al. | |
| 2006/0141155 A1 | 6/2006 | Gordon et al. | |
| 2006/0176559 A1 | 8/2006 | Takatoshi et al. | |
| 2006/0199399 A1 | 9/2006 | Muscat | |
| 2006/0226409 A1 | 10/2006 | Burr et al. | |
| 2006/0292845 A1 | 12/2006 | Chiang et al. | |
| 2007/0014919 A1 | 1/2007 | Hamalainen et al. | |
| 2007/0026654 A1 | 2/2007 | Huotari et al. | |
| 2007/0063317 A1 | 3/2007 | Kim et al. | |
| 2007/0099422 A1 | 5/2007 | Wijekoon et al. | |
| 2007/0241390 A1 | 10/2007 | Tanaka et al. | |
| 2007/0292604 A1 | 12/2007 | Dordi et al. | |
| 2008/0066680 A1 | 3/2008 | Sherman | |
| 2008/0072819 A1 | 3/2008 | Rahtu | |
| 2008/0124932 A1 | 5/2008 | Tateishi et al. | |
| 2008/0179741 A1 | 7/2008 | Streck et al. | |
| 2008/0241575 A1 | 10/2008 | Lavoie et al. | |
| 2008/0282970 A1 | 11/2008 | Heys et al. | |
| 2009/0035949 A1 | 2/2009 | Niinisto et al. | |
| 2009/0071505 A1 | 3/2009 | Miya et al. | |
| 2009/0081385 A1 | 3/2009 | Heys et al. | |
| 2009/0203222 A1 | 8/2009 | Dussarrat et al. | |
| 2009/0269507 A1 | 10/2009 | Yu et al. | |
| 2009/0274887 A1 | 11/2009 | Millward et al. | |
| 2009/0311879 A1 | 12/2009 | Blasco et al. | |
| 2010/0015756 A1 | 1/2010 | Weidman et al. | |
| 2010/0147396 A1 | 6/2010 | Yamagishi et al. | |
| 2010/0178468 A1 | 7/2010 | Jiang et al. | |
| 2010/0248473 A1 | 9/2010 | Ishizaka et al. | |
| 2010/0270626 A1 | 10/2010 | Raisanen | |
| 2010/0297474 A1 | 11/2010 | Dameron | |
| 2011/0053800 A1 | 3/2011 | Jung et al. | |
| 2011/0124192 A1 | 5/2011 | Ganguli et al. | |
| 2011/0146568 A1 | 6/2011 | Haukka et al. | |
| 2011/0221061 A1 | 9/2011 | Prakash | |
| 2011/0311726 A1 | 12/2011 | Liu et al. | |
| 2012/0032311 A1 | 2/2012 | Gates | |
| 2012/0046421 A1 | 2/2012 | Darling et al. | |
| 2012/0052681 A1 | 3/2012 | Marsh | |
| 2012/0088369 A1 | 4/2012 | Weidman et al. | |
| 2012/0189868 A1 | 7/2012 | Borovik et al. | |
| 2012/0219824 A1 | 8/2012 | Prolier et al. | |
| 2012/0264291 A1 | 10/2012 | Ganguli et al. | |
| 2012/0269970 A1 | 10/2012 | Ido et al. | |
| 2013/0005133 A1 | 1/2013 | Lee et al. | |

(56) References Cited

U.S. PATENT DOCUMENTS

| | | |
|---|---|---|
| 2013/0078793 A1 | 3/2013 | Sun et al. |
| 2013/0089983 A1 | 4/2013 | Sugita et al. |
| 2013/0095664 A1 | 4/2013 | Matero et al. |
| 2013/0115768 A1 | 5/2013 | Pore et al. |
| 2013/0146881 A1 | 6/2013 | Yamazaki et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0273290 A1 | 9/2014 | Somervell |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1* | 6/2015 | Romero ............ H01L 21/76838 438/641 |
| 2015/0179798 A1 | 6/2015 | Clendenning et al. |
| 2015/0240121 A1 | 8/2015 | Sugita et al. |
| 2015/0299848 A1* | 10/2015 | Haukka .................. C23C 16/18 427/123 |
| 2015/0371866 A1 | 12/2015 | Chen et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0293398 A1 | 10/2016 | Danek et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0352533 A1 | 12/2017 | Tois et al. |
| 2017/0352550 A1 | 12/2017 | Tois et al. |
| 2019/0017170 A1* | 1/2019 | Sharma ............ C23C 16/45525 |
| 2019/0057858 A1* | 2/2019 | Hausmann .......... H01L 21/0228 |
| 2019/0074441 A1* | 3/2019 | Kikuchi .............. H01L 45/1683 |

FOREIGN PATENT DOCUMENTS

| | | |
|---|---|---|
| EP | 1340269 | 2/2009 |
| JP | 2011-187583 | 9/2011 |
| JP | 2014-93331 | 5/2014 |
| KR | 102001001072 | 2/2001 |
| KR | 20030027392 | 4/2003 |
| KR | 1020040056026 | 6/2004 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2017/184357 | 10/2017 |
| WO | WO 2017/184358 | 10/2017 |

OTHER PUBLICATIONS

Ting, Chiu H., et al., "Selective Electroless Metal Deposition for Integrated Circuit Fabrication". J. Electrochem. Soc., vol. 136, No. 2, Feb. 1989, pp. 456-462.*

Hashemi, Fatemeh Sadat Minaye, et al., "A New Resist for Area Selective Atomic and Molecular Layer Deposition on Metal-Dielectric Patterns". The Journal of Physical Chemistry C, 2014, 118, 10957-10962. (published dated May 2, 2014).*

Lecordier, Laurent, et al., "Vapor-deposited octadecanethiol masking layer on copper to enable area selective Hf3N4 atomic layer deposition on dielectrics studied by in situ spectroscopic ellipsometry". J. Vac. Sci. Technol. A 36(3), May/Jun. 2018, pp. 031605-1 to 031605-8.*

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

(56) References Cited

OTHER PUBLICATIONS

Farm et al. Selective-Area Atomic Layer Deposition Using Poly(methyl methacrylate) Films as Mask Layers, J. Phys. Chem. C, 2008, 112, pp. 15791-15795. (Year: 2008).

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

George, Steven M., "Atomic Layer Deposition: An Overview", Chem. Rev. 2010, 110, pp. 111-113.

Ghosal et al., Controlling Atomic Layer Deposition of Ti02 in Aerogels through Surface Functionalization, Chem. Matter, vol. 21, pp. 1989-1992, 2009.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.

Lee et al., Area-Selective Atomic Layer Deposition Using Self-Assembled Monolayer and Scanning Probe Lithography, Journal of the Electrochemical Society, vol. 156, Issue 9, pp. G125-G128, 2009.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

Lemonds, A.M., "Atomic layer deposition of TaSix thin films on SiO2 using TaF5 and Si2H6", Thin Solid Films 488, 2005 pp. 9-14.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Low et al., Selective deposition of CVD iron on silicon dioxide and tungsten, Microelectronic Engineering 83, pp. 2229-2233, 2006.

Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high-purity Pt nanostructures by combining electron beam induced deposition and atomic layer deposition, Journal of Applied Physics, vol. 107, pp. 116102-1-116102-3, 2010.

Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.

Norrman, et al.; 6 Studies of Spin-Coated Polymer Films; Annu. Rep. Prag. Chem.; Sect. C; 2005; 101; pp. 174-201.

File History of U.S. Appl. No. 15/177,195, filed Jun. 8, 2016.
File History of U.S. Appl. No. 13/708,863, filed Dec. 7, 2012.
Office Action dated Jun. 8, 2017 in Korean Application No. 2013-7000596.

Overhage et al., Selective Atomic Layer Deposition (SALD) of Titanium Dioxide on Silicon and Copper Patterned Substrates, Journal of Undergraduate Research 4, 29, Mar. 2011 in 4 pages.

Parulekar et al., Atomic Layer Deposition of Zirconium Oxide on Copper Patterned Silicon Substrate, Journal of Undergraduate Research, vol. 7, pp. 15-17, 2014.

Parulekar et al., Selective atomic layer deposition of zirconium oxide on copper patterned silicon substrate, pp. 1-6, 2013.

Prasittichai et al., "Area Selective Molecular Layer Deposition of Polyurea Film", Applied Materials & Interfaces, 2013, vol. 5, pp. 13391-13396.

Proslier et al., "Atomic Layer Deposition and Superconducting Properties of NbSi Films", The Journal of Physical Chemistry C, 2011, vol. 115, No. 50, pp. 1-26.

Putkonen, et al.; Atomic Layer Deposition of Polyimide Thin Films; Journal of Materials Chemistry; 2007, 17, pp. 664-669.

Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.

Roberts et al., "Selective Mn deposition on Cu lines", poster presentation, 12th International Conference on Atomic Layer Deposition, Jun. 19, 2012, Dresden, Germany, no page numbers.

Sapp, et al.; Thermo-Mechanical and Electrical Characterization of Through-Silicon Vias with a Vapor Deposited Polyimide Dielectric Liner; IEEE; 2012, no page numbers.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

Senesky et al., "Aluminum nitride as a masking material for the plasma etching of silicon carbide structures," 2010, IEEE, pp. 352-355.

Sundberg, et al.; Organic and Inorganic-Organic Thin Film Structures by Molecular Layer Deposition: A Review; Beilstein J. Nanotechnol; 2014, 5, pp. 1104-1136.

Toirov, et al.; Thermal Cyclodehydration of Polyamic Acid Initiated by UV-Irradiation; Iranian Polymer Journal; vol. 5, No. 1; pp. 16-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01 B104-1-01 B104-7, Jan. 2017.

Vervuurt et al., "Area-selective atomic layer deposition of platinum using photosensitive polyimide", Nanotechnology 27, 2016, in 6 pages.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

Ellinger et al., "Selective Area Spatial Atomic Layer Deposition of ZnO, Al2O3, and Aluminum-Doped ZnO Using Poly(vinyl pyrolidone)", Chem. Mater. 2014, 26, pp. 1514-1522.

Aaltonen et al., "Atomic Layer Deposition of Iridium Thin Films", Journal of The Electrochemical Society, 151 (8) G489-G492 (2004).

Benzotriazole, Wikipedia via https://en.wikipedia.org/wiki/Benzotriazole; pp. 1-5, no date available.

(56) References Cited

OTHER PUBLICATIONS

Farm et al., "Self-Assembled Octadecyltrimethoxysilane Monolayers Enabling Selective-Area Atomic Layer Deposition of Iridium", Chem. Vap. Deposition, 2006, 12, pp. 415-417.
File History of U.S. Appl. No. 14/612,784, filed Feb. 3, 2015.
File History of U.S. Appl. No. 14/687,833, filed Apr. 15, 2015.
File History of U.S. Appl. No. 16/100,855, filed Aug. 10, 2018.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 15/221,453, filed Jul. 27, 2016.
File History of U.S. Appl. No. 15/795,768, filed Oct. 27, 2017.
File History of U.S. Appl. No. 16/040,844, filed Jul. 20, 2018.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Mackus et al., "The use of atomic layer deposition in advanced nanopatterning", Nanoscale, 2014, 6, pp. 10941-10960.
Schuiskly et al., "Atomic Layer Deposition of Thin Films Using O2 as Oxygen Source", Langmuir, vol. 17, No. 18, 2001, pp. 5508-5512.
Suntola, Tuomo, "Thin Films and Epitaxy Part B: Grown mechanism and Dynamics", Handbook of Crystal Growth vol. 3, Elsevier, 1994, 33 pages.

\* cited by examiner

SELECTIVE DEPOSITION OF METALS, METAL OXIDES, AND DIELECTRICS

This application is a continuation of U.S. application Ser. No. 14/612,784, filed Feb. 3, 2015, now U.S. Pat. No. 9,895,715, which claims priority to U.S. Provisional Application No. 61/935,798, filed Feb. 4, 2014, each of which is hereby incorporated by reference in its entirety.

BACKGROUND OF THE INVENTION

Field of the Invention

The present application relates to selective deposition on a first surface of a substrate relative to a second surface.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a selective deposition process, wherein a material is selectively deposited on a first surface relative to a second surface without the need, or with reduced need for subsequent processing. Methods are disclosed herein for selective deposition on a first surface of substrate relative to a second, different surface of the substrate.

SUMMARY OF THE INVENTION

According to some aspects of the present disclosure, selective deposition can be used to deposit a material on a first surface of a substrate relative to a second, different surface of a substrate. In some embodiments atomic layer deposition (ALD) type processes are used. In some embodiments a metal is selectively deposited on a first surface of a substrate relative to a second different surface of a substrate. In some embodiments a metal oxide is selectively deposited on a first surface of a substrate relative to a second different surface of a substrate. In some embodiments a dielectric is selectively deposited on a first surface of a substrate relative to a second different surface of a substrate.

In some embodiments the material is selectively deposited on the first surface relative to the second, different surface with a selectivity of at least 90%. In some embodiments the selectivity is retained for up to 20 deposition cycles.

In some embodiments a substrate comprising a first surface and a second, different surface is provided and a metal is selectively deposited on the first surface relative to the second surface using an ALD type process comprising a plurality of deposition cycles, each cycle comprising alternately and sequentially contacting a substrate with a vapor phase metal precursor and a vapor phase second reactant. In some embodiments the selectively deposited metal is selected from Sb and Ge.

In some embodiments the metal precursor comprises a Sb reactant having the formula $SbX_3$, where X is a halogen.

In some embodiments the first surface is a metal surface and the second surface comprises OH terminations and the metal is selectively deposited on the first surface relative to the second surface. In some embodiments the metal surface is a Ni, Co, Cu, Al, Ru, or another noble metal surface. In some embodiments the second surface is a dielectric surface, such as $SiO_2$, $GeO_2$, or a low-k surface. In some embodiments the second surface is treated to provide OH termination. In some embodiments the second surface is deactivated.

In some embodiments a substrate comprising a first surface and a second, different surface is provided and a dielectric is selectively deposited on the first surface relative to the second surface using an ALD type process comprising a plurality of deposition cycles, each cycle comprising alternately and sequentially contacting a substrate with a vapor phase first precursor and a vapor phase second reactant. In some embodiments the selectively deposited dielectric material is selected from $GeO_2$, $SiO_2$ and MgO.

In some embodiments the first precursor comprises a Ge-alkylamine and the second reactant is water. In some embodiments the first precursor comprises an aminosilane precursor and the second reactant comprises ozone. In some embodiments the first precursor comprises $Mg(Cp)_2$ and the second reactant is selected from water, ozone and a combination of water and ozone.

In some embodiments the first surface is a dielectric surface and the second surface is a metal surface. In some embodiments the first surface is a dielectric surface, such as $SiO_2$, $GeO_2$, or a low-k surface. In some embodiments the metal surface is treated to inhibit deposition of the dielectric material thereon prior to selective deposition. In some embodiments the metal surface is oxidized prior to selective deposition. In some embodiments the metal surface is passivated prior to selective deposition.

In some embodiments the first surface is a porous, low-k film. The porous, low-k film may be present in a dual damascene structure, for example. In some embodiments a dielectric is selectively deposited as a pore sealing layer on the porous, low-k film. In some embodiments the dielectric material is $GeO_2$ or MgO. In some embodiments the pore sealing layer is deposited on the low-k film without significantly increasing the effective k value. In some embodiments the pore sealing layer seals pore of about 3 nm or less in diameter.

In some embodiments a substrate comprising a first surface and a second, different surface is provided and a metal or metal oxide is selectively deposited on the first surface relative to the second surface using an ALD type process comprising a plurality of deposition cycles, each cycle comprising alternately and sequentially contacting a substrate with a vapor phase first precursor and a vapor phase second reactant. In some embodiments the selectively deposited material is selected from Ni, Fe, Co, NiOx, FeOx, and CoOx.

In some embodiments the first surface is a dielectric surface and the second surface is a metal surface. In some embodiments the second surface is a dielectric surface, such as SiO2, GeO2, or a low-k surface. In some embodiments the metal surface is treated to inhibit deposition of the dielectric material thereon prior to selective deposition. In some embodiments the metal surface is oxidized prior to selective deposition. In some embodiments the metal surface is passivated prior to selective deposition.

BRIEF DESCRIPTION OF THE DRAWINGS

The invention will be better understood from the Detailed Description and from the appended drawings, which are meant to illustrate and not to limit the invention, and wherein.

DETAILED DESCRIPTION OF SOME EMBODIMENTS

Figure 1:
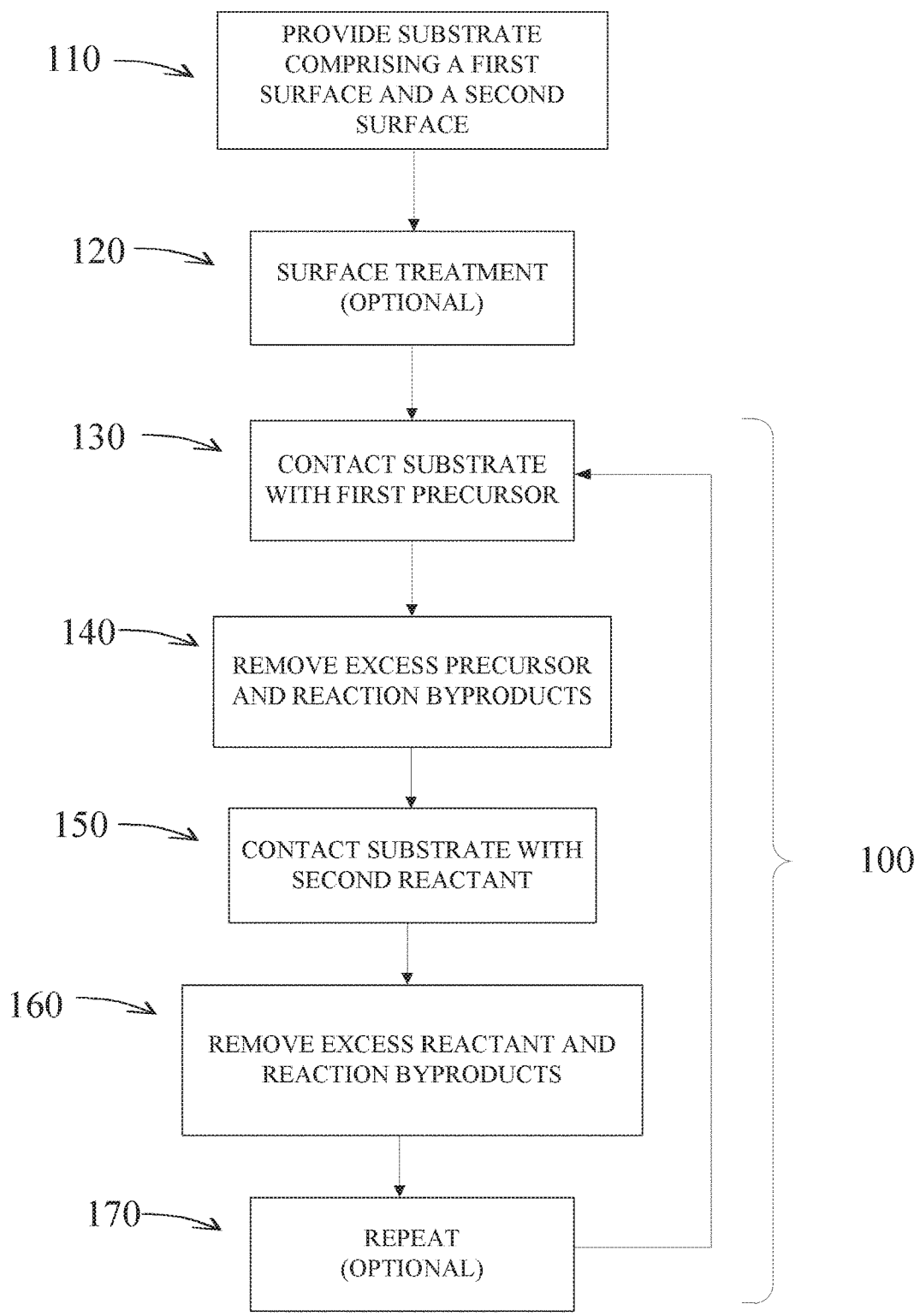
FIG. 1 illustrates a deposition process flow for selectively depositing a material on a first surface of a substrate relative to a second, different surface of the same substrate.

In some situations it is desirable to selectively deposit a material on one surface of a substrate relative to a second, different surface of the same substrate. For example, selective deposition may be used to form capping layers, barrier layers, etch stop layers, sacrificial and/or protective layers or for sealing pores, such as in porous low k materials. For example, a metallic material may be deposited selectively on a first metal surface of a substrate preferentially over a second, different surface, such as a dielectric surface of the same substrate. In other embodiments a dielectric material, such as an oxide, may be deposited selectively on a first dielectric surface relative to a second surface, such as a conductive surface, metal surface, or H-terminated surface of the same substrate.

One or more surfaces may be treated in order to enhance deposition on one surface relative to one or more different surfaces. In some embodiments a first surface is treated, or activated, in order to enhance deposition on the first surface relative to a second surface. In some embodiments a second surface is treated, or deactivated, in order to decrease deposition on the second surface relative to a first surface. In some embodiments a first surface is treated to enhance deposition and a second surface is treated to decrease deposition, thereby increasing selective deposition on the first surface relative to the second surface. In some embodiments the deactivating treatment does not involve formation of a self-assembled monolayer (SAM) or a similar monolayer having a long carbon chain. In some embodiments the deactivating treatment is not treatment with an organic agent. For example, in some embodiments the deactivating treatment may be oxidation or halogenation, such as chlorination of the surface.

For example, in some embodiments a dielectric material is deposited on a first dielectric surface of a substrate relative to a second metal surface, and the second metal surface is oxidized prior to or at the beginning of the dielectric material depositions in order to decrease deposition of an oxide on the metal surface relative to the dielectric surface. That is, selective deposition on the dielectric surface is increased relative to the treated metal surface. In some embodiments the metal surface is passivated, such as by treating the surface such that it comprises alkylsilyl groups. The passivation may facilitate selective deposition on the dielectric surface relative to the treated metal surface. For example, deposition of an oxide on the metal surface may be inhibited by the passivation. In some embodiments passivation does not include formation of a single atomic monolayer (SAM) or a similar monolayer having a long carbon chain on the metal surface. In some embodiments a dielectric surface may be treated to facilitate selective deposition of a metal on a metal surface relative to the dielectric surface. For example, the dielectric surface may be treated to provide a hydrophilic OH-terminated surface. While an OH-terminated surface can be reactive to certain precursors, other precursors may not react with this termination. For example, an OH-terminated surface can be passive against Cu-amidinate compound adsorption or ruthenium compound adsorption, which have two cyclopentadienyl (or a derivative thereof) ligands. Thus, in some embodiments OH-termination can be used to inhibit deposition of a metal on a dielectric surface relative to a metal surface.

The surface of dielectric materials such as SiO2 or GeO2 may comprise hydroxyl, or OH-groups which have the effect of making the surface hydrophilic. Such OH-group surface terminations can occur naturally when the surface is exposed to ambient conditions. In some embodiments the dielectric surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25 C and 40 C. In some embodiments the dielectric surface is exposed to air in order to provide a hydrophilic surface that comprises at least some OH-groups. In some embodiments a hydrophilic surface is not treated prior to deposition.

In some embodiments a dielectric surface can be passivated to inhibit deposition of a metal thereon. For example, the dielectric surface may be contacted with a chemical that provides a silylated (—Si—$(CH_3)_x$ or —Si$(CH_3)_3$) surface or a halogenated surface or a —$SiH_3$ surface. In some embodiments the dielectric surface is chlorinated or fluorinated, such as a Si—Cl surface. A halogenated surface can be achieved by treating the surface with a halide chemical, such as $CCl_4$ or a metal halide, which is capable of forming volatile metal oxyhalides, such as $WF_6$, $NbF_5$, or $NbCl_5$, and leaving the halide, such as the chloride or fluoride on the surface. The passivation can be used to inhibit deposition of a metal on the dielectric surface relative to a metal surface. In some embodiments the passivation chemical is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —NR$_1$R$_2$, wherein each R$_1$ can be independently selected to be hydrogen or C1-C5 hydrocarbon, preferably methyl or ethyl, R$_2$ can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino) silane, or a silane compound comprising a SiH$_3$ group, or silazane, such hexamethyldisilazane (HMDS).

In some embodiments a semiconductor substrate is provided that comprises a first surface comprising a first material and a second surface comprising a second material that is different from the first material. In some embodiments the first surface is hydrophilic and may comprise an OH-terminated surface or a surface having some amount of OH-groups. In some embodiments the first surface may be, for example and without limitation, a low-k material, SiO$_2$ or GeO$_2$. In some embodiments the second surface is a metal surface. In some embodiments the second surface is a conductive surface. In some embodiments the second surface is a H-terminated surface. For example, the second surface may comprise, for example, Cu, Ni, Co, Al, Ru or another noble metal. For the purposes of the present application, Sb and Ge are considered to be metals. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the deposition process is an atomic layer deposition (ALD) type process. In some embodiments the deposition process is a pure ALD process. In some embodiments the deposition process is a vapor deposition process comprising one or more deposition cycles in which a substrate is alternately and sequentially contacted with a first vapor phase reactant and a second vapor phase reactant.

In some embodiments, a Sb layer is selectively deposited on a first metal surface on a substrate relative to a second dielectric surface on the same substrate. In some embodiments, prior to deposition of the Sb layer the second dielectric surface is treated with a passivation chemical to form a passivated surface, such as a silylated —Si—(CH$_3$)$_x$ or —Si(CH$_3$)$_3$ surface or a H-terminated surface, such as a —SiH$_3$ surface or a halogenated surface, such as a chlorinated or fluorinated surface. As used herein a passivated surface is a surface that is passive against deposition of a certain material, or a surface that is passive with respect to certain precursors used in a selective deposition process. For example, the halogenated surface may be a Si—Cl surface. In some embodiments the first metal surface may comprise, for example, Cu, Al, Ni, Co, Ru or another noble metal. In some embodiments the first metal surface is oxygen terminated or an oxidized surface.

In some embodiments a Ge layer is selectively deposited on a first metal surface of a substrate relative to a second dielectric surface on the same substrate. In some embodiments the first surface may comprise, for example, Cu, Al, Co, Ni, Ru or another noble metal.

In some embodiments, a GeO$_2$ layer is deposited on a first dielectric surface of a substrate relative to a second surface of the same substrate, such as a conductive surface, metal surface, or H-terminated surface. In some embodiments the first surface may be, for example and without limitation, a low-k material, SiO$_2$ or GeO$_2$. The second surface may comprise, for example, Cu, Al, Ni, Co, Ru or another noble metal. In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments a SiO$_2$ layer is deposited on a first dielectric surface of a substrate relative to a second surface of the same substrate, such as a conductive surface, metal surface, or H-terminated surface. In some embodiments the first surface may be, for example and without limitation, a low-k material, SiO$_2$ or GeO$_2$. The conductive surface may comprise, for example, Cu, Al, Co, Ni, Ru or another noble metal. In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments a MgO layer is deposited on a first dielectric surface of a substrate relative to a second surface of the same substrate, such as a conductive surface, metal surface, or H-terminated surface. In some embodiments the first surface may be, for example and without limitation, a low-k material, SiO$_2$ or GeO$_2$. The conductive surface may comprise, for example, Cu, Al, Co, Ni, Ru or another noble metal. In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the selective deposition processes disclosed herein do not utilize plasma, such as direct plasma. In some instances, however, a selective deposition process could utilize radicals made by plasma as a reactant. The radicals are preferably not too energetic and thus do not destroy or degrade a surface of the substrate. Typically direct plasma can harm the second surface of the substrate too significantly to be useful, and thus is not used in some embodiments.

In some embodiments deposition on the first surface of the substrate relative to the second surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular application.

In some embodiments an etch may be used subsequent to or in the course of deposition to remove material that is non-selectively deposited. Although addition of an etch step would typically add cost and complexity to the process, in some situations it may be commercially desirable, for example if it is overall less expensive than other options. In some embodiments the etch process may be a wet etch process or a dry etch process. In some embodiments a dry etch is preferable.

In some embodiments deposition on the first surface of the substrate relative to the second surface of the substrate can be performed up to about 500 deposition cycles before losing the selectivity, or up to about 50 deposition cycles, or up to about 20 deposition cycles, or up to about 10 deposition cycles, or up to about 5 deposition cycles before losing selectivity. In some embodiments even deposition of 1 or 2 cycles before losing selectivity can be useful.

A loss of selectivity can be understood to have occurred when the selectivities mentioned above are no longer met. Depending on the specific circumstances, a loss of selectivity may be considered to have occurred when deposition on the first surface of the substrate relative to the second surface of the substrate is less than about 90% selective, less than about 95% selective, less than about 96%, 97%, 98% or 99% selective or greater.

In some embodiments deposition on the first surface of the substrate relative to the second surface of the substrate can be performed up to a thickness of about 50 nm before losing the selectivity, or up to about 10 nm, or up to about 5 nm, or up to about 3 nm, or up to about 2 nm, or up to about 1 nm before losing selectivity. In some embodiments even deposition of up to 3 Å or 5 Å before losing selectivity can be useful. Depending on the specific circumstances, a loss of selectivity may be considered to have occurred when deposition on the first surface of the substrate relative to the second surface of the substrate is less than about 90% selective, less than about 95% selective, less than about 96%, 97%, 98% or 99% selective or greater.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses.

Briefly, a substrate comprising a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the type of film being deposited and is preferably at or below about 400° C., more preferably at or below about 200° C. and most preferably from about 20° C. to about 200° C.

The surface of the substrate is contacted with a vapor phase first reactant. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. patent application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Referring to FIG. 1 and according to some embodiments a substrate comprising a first surface and a second surface is provided at step 110 and a material is selectively deposited on a first surface of the substrate relative to a second surface by an ALD type deposition process 100 comprising multiple cycles, each cycle comprising:

contacting the surface of a substrate with a vaporized first precursor at step 130;

removing excess first precursor and reaction by products, if any, from the surface at step 140;

contacting the surface of the substrate with a second vaporized reactant at step 150;

removing from the surface, at step 160, excess second reactant and any gaseous by-products formed in the reaction between the first precursor layer on the first surface of the substrate and the second reactant, and;

repeating at step 170 the contacting and removing steps until a thin film comprising the selectively deposited material of the desired thickness has been formed.

As mentioned above, in some embodiments one or more surfaces of the substrate may be treated in order to enhance deposition on one surface relative to one or more different surfaces prior to beginning the deposition process 100. In FIG. 1 this is indicated by step 120.

Although the illustrated deposition cycle begins with contacting the surface of the substrate with the first precursor, in other embodiments the deposition cycle begins with contacting the surface of the substrate with the second reactant. It will be understood by the skilled artisan that contacting the substrate surface with the first precursor and second reactant are interchangeable in the ALD cycle.

In some embodiments, the reactants and reaction by-products can be removed from the substrate surface by stopping the flow of first precursor while continuing the flow of an inert carrier gas such as nitrogen or argon.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

Selective Deposition of Metal on Metal

As mentioned above, in some embodiments a metal is selectively deposited on a first metal surface of a substrate relative to a second, different surface, such as a dielectric surface of the same substrate. In some embodiments the first metal surface is a noble metal surface. In some embodiments the first metal surface is an Al, Cu, Ru, Ni, Co, or other noble metal surface. In some embodiments the first surface comprises a metal selected individually from Cu, Ni, Co, Al, Ru and other noble metals. In some embodiments the first surface is a Cu surface. In some embodiments the first surface is a Ni surface. In some embodiments the first surface is a Co surface. In some embodiments the first surface is an Al surface. In some embodiments the first surface is a Ru surface. In some embodiments the first surface comprises a noble metal. In some embodiments the second, non-metal surface, is a hydrophilic, OH-terminated surface or contains some amount of OH-groups. In some embodiments the second surface is a —NH, terminated surface. In some embodiments the second surface is a —SH, terminated surface. In some embodiments the second, non-metal, surface is a dielectric surface. In some embodiments the second, non-metal surface is $SiO_2$, $GeO_2$, or low-k material.

In some embodiments the second, non-metal surface is deactivated, such as by a treatment to provide a surface on which metal deposition is inhibited. In some embodiments deactivation may comprise treatment with a passivation chemical. In some embodiments the deactivation treatment can occur prior to the deposition of a metal on a first metal surface. In some embodiments the deactivation treatment may be an in situ deactivation treatment. In some embodiments deactivation of the hydrophilic surface may comprise replacing at least OH-groups with other groups. In some embodiments deactivation can include treatment to increase the amount of OH-groups on the second, non-metal, surface.

In some embodiments the second surface is deactivated, such as by passivation prior to deposition of a metal. In some embodiments deactivation of the second surface may comprise replacing at least some OH-groups with other groups. In some embodiments the second surface is treated with a passivation chemical to form a passivated surface. For example, the second surface may be silylated or halogenated, such as chlorinated or fluorinated, prior to deposition of the metal. In some embodiments the second surface may be treated to form a silylated surface, such as a silylated —Si—$(CH_3)_x$ or —Si$(CH_3)_3$ surface. In some embodiments the second surface may be treated to form a halogenated surface, such as a chlorinated or fluorinated surface. For example, the halogenated surface may be a Si—Cl surface. In some embodiments the second surface may be treated to provide a H-terminated surface, for example a —$SiH_3$ surface. For example, in some embodiments the second surface may be contacted with a chemical that provides a —$SiH_3$ surface.

In some embodiments deposition on the first surface of the substrate relative to the second surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

Selective Deposition of Sb on Metal by ALD

In some embodiments Sb is selectively deposited on a metal surface of a substrate comprising a metal surface and a dielectric surface. In some embodiments, Sb is selectively deposited on a metal surface of a substrate, such as a Cu, Ni, Co, Al, Ru, or other noble metal surface, relative to a hydrophilic surface of the same substrate. In some embodiments Sb is selectively deposited on a Cu surface, relative to a second, different surface. In some embodiments Sb is selectively deposited on a Ni surface, relative to a second, different—surface. In some embodiments Sb is selectively deposited on a Co surface, relative to a second, different surface. In some embodiments Sb is selectively deposited on a Al surface, relative to a second, different surface. In some embodiments Sb is selectively deposited on a Ru surface, relative to a second, different surface. In some embodiments Sb is selectively deposited on a noble metal surface, relative to a second, different surface.

In some embodiments the second surface is a hydrophilic surface. In some embodiments the hydrophilic surface may comprise at least some OH-groups. In some embodiments the second surface is a —$NH_x$ terminated surface. In some embodiments the second surface is a —$SH_x$ terminated surface. In some embodiments the hydrophilic surface is a dielectric surface. In some embodiments the hydrophilic surface may comprise $SiO_2$, a low k material, or $GeO_2$.

As previously discussed, in some embodiments the second, hydrophilic surface is treated to facilitate selective deposition of Sb on a metal surface relative to the hydrophilic surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Sb. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Sb. In some embodiments the hydrophilic surface may be treated to form a silylated surface, such as a silylated —Si—$(CH_3)_x$ or —Si$(CH_3)_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —$SiH_3$ surface. For example, in some embodiments the hydrophilic surface may be contacted with a chemical that provides a H-terminated surface. In some embodiments the hydrophilic surface may be contacted with HF to provide a H-terminated surface.

In some embodiments the passivation chemical is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —$NR_1R_2$, wherein each $R_1$ can be independently selected to be hydrogen or C1-C5 hydrocarbon, preferably methyl or ethyl, $R_2$ can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino) silane, or a silane compound comprising a $SiH_3$ group, or silazane, such hexamethyldisilazane (HMDS).

In some embodiments Sb deposition on the first surface of the substrate relative to the second surface of the substrate is at least about 90% selective, at least about 95% selective, at least about 96%, 97%, 98% or 99% or greater selective. In some embodiments Sb deposition only occurs on the first surface and does not occur on the second surface. In some embodiments Sb deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments Sb is selectively deposited by an ALD type process. In some embodiments Sb is selectively deposited without the use of plasma. In some embodiments deposition may be carried out, for example, as described in U.S. Publication No. 2002/0329208 (U.S. application Ser. No. 13/504,079), which is hereby incorporated by reference.

Figure 2:
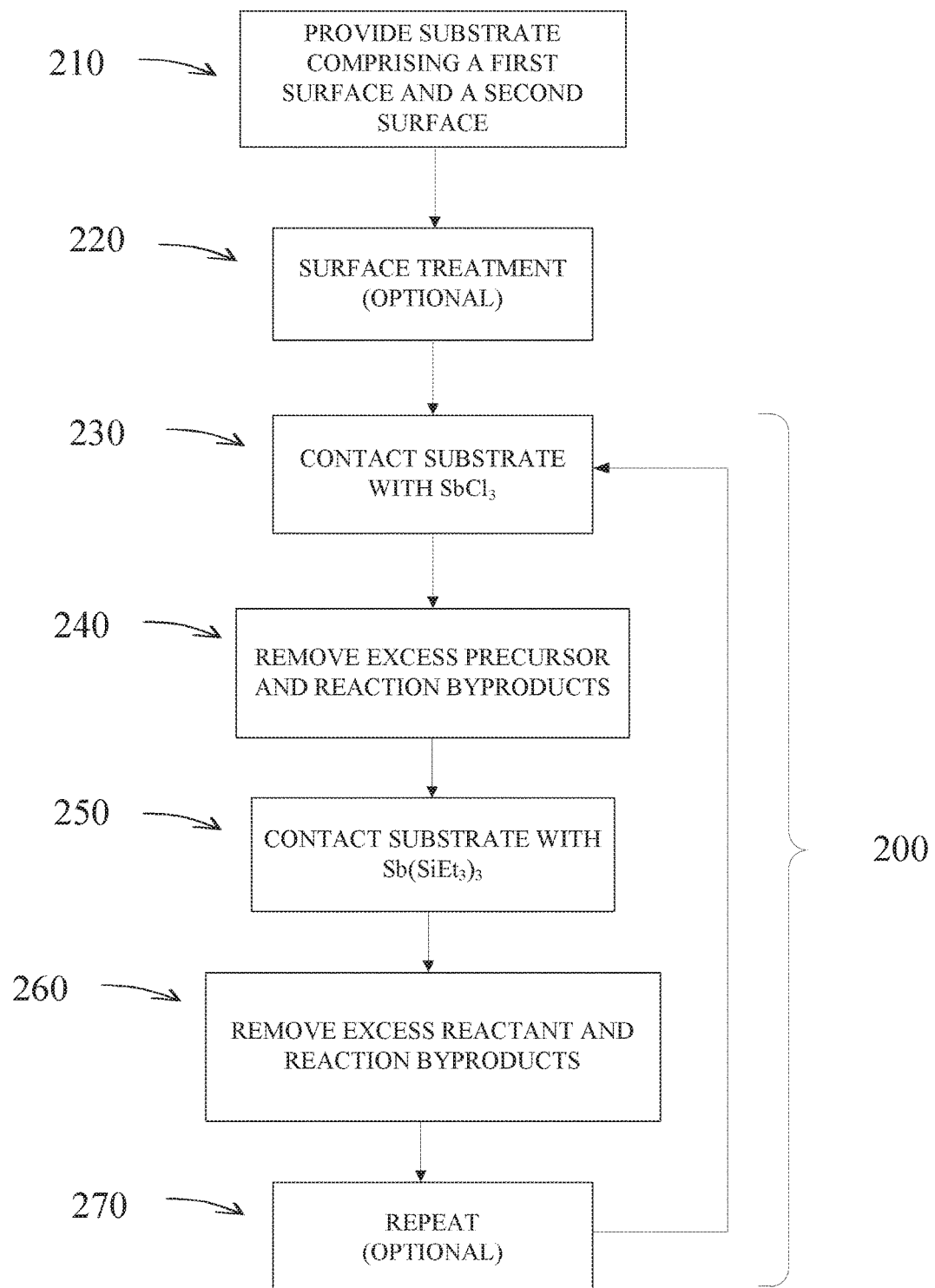
FIG. 2 illustrates a deposition process flow for selectively depositing Sb on a first surface of a substrate relative to a second, different surface of the same substrate.

Referring to FIG. 2 and according to a preferred embodiment a substrate comprising a first surface and a second surface is provided at step 210 and a metal, here Sb, is selectively deposited on a first surface of a substrate by an ALD type deposition process 100 comprising multiple cycles, each cycle comprising:

contacting the surface of a substrate with a vaporized first metal precursor, here $SbCl_3$, at step 230;

removing excess metal precursor and reaction by products, if any, from the surface at step 240;

contacting the surface of the substrate with a second vaporized reactant, here $Sb(SiEt_3)_3$, at step 250;

removing from the surface, at step 260, excess second reactant and any gaseous by-products formed in the reaction between the metal precursor layer on the first surface of the substrate and the second reactant, and;

repeating at step 270 the contacting and removing steps until a metal, here Sb, thin film of the desired thickness has been formed.

As mentioned above, in some embodiments one or more surfaces of the substrate may be treated in order to enhance deposition on one surface relative to one or more different surfaces prior to beginning the deposition process 200. In FIG. 2 this is indicated by step 220 in which the second, non-metal surface can be treated to provide an OH-terminated surface, or can be deactivated, such as by passivation, prior to deposition of the metal, here Sb.

Although the illustrated Sb deposition cycle begins with contacting the surface of the substrate with the first Sb precursor, in other embodiments the deposition cycle begins with contacting the surface of the substrate with the second reactant. It will be understood by the skilled artisan that contacting the substrate surface with the first Sb precursor and second reactant are interchangeable in the ALD cycle.

In some embodiments, the reactants and reaction by-products can be removed from the substrate surface by stopping the flow of the first precursor while continuing the flow of an inert carrier gas such as nitrogen or argon.

In some embodiments, the reactants and reaction by-products can be removed from the substrate surface by stopping the flow of second reactant while continuing the flow of an inert carrier gas such as nitrogen or argon.

In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments the second reactant can comprise a Sb precursor. In some embodiments the second reactant is a second Sb precursor. In some embodiments the second reactant is a second Sb precursor that is different from the first Sb precursor.

In some embodiments the first Sb precursor has a formula of SbX3, wherein X is a halogen element. In some embodiments the first Sb precursor is SbCl3, SbBr3 or SbI3.

In some embodiments, the second reactant is not an oxygen source. The term "oxygen source" refers to reactants that comprise oxygen, such as water, ozone, alcohol, oxygen atoms, oxygen plasma and oxygen radicals, typically used in ALD for depositing metal oxides. In some embodiments the second reactant is not water, ozone or alcohol.

In some embodiments the second reactant to be used in combination with the Sb precursors disclosed herein is not an aminogermanium precursor, such as tetraminogermanium or organotellurium precursor. In some embodiments the second reactant to be used in combination with the Sb precursors disclosed herein is not a chalcogenide precursor. In some embodiments the second reactant to be used in combination with the Sb precursors disclosed herein does not contain plasma or an excited species. In some embodiments the second reactant to be used in combination with the Sb precursors disclosed herein does not contain nitrogen. In some embodiments the second reactant to be used in combination with the Sb precursors disclosed herein is not an alkoxide substituted precursor. In some embodiments the second reactant to be used in combination with the Sb precursors disclosed herein is not an amino substituted precursor. In some embodiments the second reactant to be used in combination with the Sb precursors disclosed herein is not an alkyl substituted precursor. In some embodiments the second reactant to be used in combination with the Sb precursors disclosed herein does not contain a direct Sb—C bond.

The Sb center atoms of the Sb precursors disclosed herein can be bonded to Si, Ge, or Sn atoms. Sb is more electronegative than Si, Ge or Sn, which will create polarity in bonds and thus a partial negative charge on the Sb center atoms of the Sb precursors disclosed herein. In some embodiments, the Sb center atoms can have a negative oxidation state. It is believed, although not being bound to any theory, that the slight partial negative charge of the center atom in the precursors disclosed herein, for example the slight partial negative charge of Sb in Sb(SiEt3)3, combined with the partial positive charge of the center atom in the other precursor, for example the partial positive charge of Sb in SbCl3, makes the precursor combination successful and film deposition possible.

In some embodiments the second reactant to be used in combination with the Sb precursors disclosed herein is not a reducing agent, such as hydrogen, H2/plasma, amine, imine, hydrazine, silane, silyl chalcogenide, germane, ammonia, alkane, alkene or alkyne. As used herein a reducing agent refers to a compound capable of reducing an atom of the other reactant, usually the atom which will be deposited in the film in an ALD process and sometimes to elemental form. At the same time the reducing agent can be oxidized. It may be noted that with oxidative chemistry, for example with an oxidation agent, it is also possible to produce elemental films if the formal oxidation states of the atom, which will be deposited, are negative in the other precursor. In some embodiments the Sb precursors disclosed herein act as a reducing agent in an ALD process.

In some embodiments the second reactant to be used in combination with Sb precursors disclosed herein is an oxidizing precursor, such as SbCl3. Preferably the oxidizing precursor is not water, alcohol or ozone. As used herein an oxidizing precursor is a precursor, which has a partial positive charge in the center atom of the molecule, such as Sb in case of SbCl3, and thus center atoms can be considered to have positive oxidation states. The partial positive charge of the oxidizing precursors will be decreased in the deposited film i.e. the center atom of the molecule can be considered to be somewhat reduced although no real oxidation state increase has happened. In some embodiments the antimony deposition cycle only uses two reactive compounds.

Preferably, the second reactant is a Sb precursor with a formula of Sb(SiR1R2R3)3, wherein R1, R2, and R3 are alkyl groups comprising one or more carbon atoms. The R1, R2, and R3 alkyl groups can be selected based on the desired physical properties of the precursor such as volatility, vapor pressure, toxicity, etc In some embodiments the first Sb precursor is SbCl3 and the second Sb precursor is Sb(SiEt3)3.

The substrate temperature during selective Sb thin film deposition is preferably less than 250° C. and more preferably less than 200° C. and even more preferably below 150° C.

Pressure of the reactor can vary much depending from the reactor used for the depositions. Typically reactor pressures are below normal ambient pressure.

The skilled artisan can determine the optimal reactant evaporation temperatures based on the properties of the selected precursors. The evaporation temperatures for the second Sb precursor, such as Sb(SiEt3)3, which can be synthesized by the methods described herein, is typically about 85° C. The evaporation temperature for the first Sb precursor, such as SbCl3, is typically about 30° C. to 35° C.

The skilled artisan can determine the optimal reactant contact times through routine experimentation based on the properties of the selected precursors and the desired properties of the deposited Sb thin film. Preferably the first and second Sb reactants are contacted for about 0.05 to 10 seconds, more preferably about 0.2 to 4 seconds, and most preferably about 1 to 2 seconds. The removal steps in which excess reactant and reaction by-products, if any, are removed are preferably about 0.05 to 10 seconds, more preferably about 0.2-4 seconds, and most preferably 1 to 2 seconds in length.

The growth rate of the elemental Sb thin films will vary depending on the reaction conditions. As described below, in initial experiments, the growth rate varied between about 0.3 and about 0.5 Å/cycle.

As previously discussed, in some embodiments Sb deposition on the first surface of the substrate relative to the second surface of the substrate is at least about 90% selective, at least about 95% selective, at least about 96%, 97%, 98% or 99% or greater selective. In some embodiments Sb deposition only occurs on the first surface and does not occur on the second surface. In some embodiments Sb deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

Sb Precursors

Precursors that may be used as a first or second reactant in ALD type selective deposition processes for Sb disclosed herein are discussed below.

In some embodiments the Sb precursors disclosed herein can be the first Sb precursor. In some embodiments the Sb precursors disclosed herein can be the second reactant. In some embodiments the Sb precursors disclosed herein can be the first Sb precursor or the second reactant. In some embodiments the Sb precursors disclosed herein can be the first Sb precursor and the second reactant. In some embodiments the first Sb precursor is a Sb precursor disclosed herein and the second reactant is a second, different Sb precursor disclosed herein.

In some embodiments Sb precursors that may be used as the first Sb precursor, the second reactant, or both include, Sb halides, such as $SbCl_3$ and $SbI_3$, Sb alkoxides, such as $Sb(OEt)_3$ and Sb amides.

In some embodiments a Sb precursor has Sb bound to at least one silicon atom, preferably at least to two silicon atoms and more preferably Sb is bound to three silicon atoms. For example it can have a general formula of $Sb(AR1R2R3)_3$, wherein A is Si or Ge, and R1, R2, and R3 are alkyl groups comprising one or more carbon atoms. Each of the R1, R2 and R3 ligands can be selected independently of each other. The R1, R2, and R3 alkyl groups can be selected independently of each other in each ligand based on the desired physical properties of the precursor such as volatility, vapor pressure, toxicity, etc. In some embodiments, R1, R2 and/or R3 can be hydrogen, alkenyl, alkynyl or aryl groups. In some embodiments, R1, R2, R3 can be any organic groups containing heteroatoms, such as N, O, F, Si, P, S, Cl, Br or I. In some embodiments R1, R2, R3 can be halogen atoms. In some embodiments the Sb precursor have a general formula of $Sb(SiR1R2R3)_3$, wherein R1, R2, and R3 are alkyl groups comprising one or more carbon atoms. In some embodiments, R1, R2 and/or R3 can be unsubstituted or substituted C1-C2 alkyls, such as methyl or ethyl groups. The R1, R2, and R3 alkyl groups can be selected independently of each other in each ligand based on the desired physical properties of the precursor such as volatility, vapor pressure, toxicity, etc In some embodiments the Sb precursor is $Sb(SiMe_2tBu)_3$. In other embodiments the precursor is $Sb(SiEt_3)_3$ or $Sb(SiMe_3)_3$. In more preferred embodiments the precursor has a Sb—Si bond and most preferably a three Si—Sb bond structure.

In some embodiments a Sb precursor has a general formula of $Sb[A1(X1R1R2R3)_3][A2(X2R4R5R6)_3][A3(X3R7R8R9)_3]$ wherein A1, A2, A3 can be independently selected to be Si or Ge and wherein R1, R2, R3, R4, R5, R6, R7, R8, and R9, can be independently selected to be alkyl, hydrogen, alkenyl, alkynyl or aryl groups. In some embodiments, R1, R2, R3, R4, R5, R6, R7, R8, and R9 can be any organic groups containing also heteroatoms, such as N, O, F, Si, P, S, Cl, Br or I. In some embodiments one or more R1, R2, R3, R4, R5, R6, R7, R8, and R9 can be halogen atoms. In some embodiments X1, X2, and X3 can be Si, Ge, N, or O. In some embodiments X1, X2, and X3 are different elements. In embodiments when X is Si then Si will be bound to three R groups, for example $Sb[Si(SiR1R2R3)_3][Si(SiR4R5R6)_3][Si(SiR7R8R9)_3]$. In embodiments when X is N then nitrogen will only be bound to two R groups $Sb[Si(NR1R2)3][Si(NR3R4)3][Si(NR5R6)3]$. In embodiments when X is O, the oxygen will only be bound to one R group, for example $Sb[Si(OR1)_3][Si(OR2)_3][Si(OR3)_3]$. R1, R2, R3, R4, R5, R6, R7, R8, and R9 groups can be selected independently of each other in each ligand based on the desired physical properties of the precursor such as volatility, vapor pressure, toxicity, etc.

Selective Deposition of Ge on Metal

In some embodiments Ge is selectively deposited on a metal surface, such as Ni, Co, Cu, Al, Ru, or other noble metal relative to a hydrophilic surface of the same substrate, such as a passivated surface. In some embodiments Ge is selectively deposited on a Cu surface, relative to a second, different surface. In some embodiments Ge is selectively deposited on a Ni surface, relative to a second, different— surface. In some embodiments Ge is selectively deposited on a Co surface, relative to a second, different surface. In some embodiments Ge is selectively deposited on a Al surface, relative to a second, different surface. In some embodiments Ge is selectively deposited on a Ru surface, relative to a second, different surface. In some embodiments Ge is selectively deposited on a noble metal surface, relative to a second, different surface.

In some embodiments Ge is selectively deposited by a process such as that described in U.S. application Ser. No. 14/135,383, filed Dec. 19, 2013, which is hereby incorporated by reference.

In some embodiments Ge deposition on the first surface of the substrate relative to the second surface of the substrate is at least about 90% selective, at least about 95% selective, at least about 96%, 97%, 98% or 99% or greater selective. In some embodiments Ge deposition only occurs on the first surface and does not occur on the second surface. In some embodiments Ge deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is a hydrophilic surface. In some embodiments the hydrophilic surface may comprise at least some OH-groups. In some embodiments the second surface is a —$NH_x$ terminated surface. In some embodiments the second surface is a —$SH_x$ terminated surface. In some embodiments the hydrophilic surface is a dielectric surface. In some embodiments the hydrophilic surface may comprise $SiO_2$, a low k material, or $GeO_2$. In some embodiments Ge is selectively deposited by an ALD type deposition process. For example, the substrate may be alternately and sequentially contacted with a germanium reactant, such as a germanium alkoxide or alkylamine and a second reactant, such as a nitrogen reactant like $NH_3$.

As previously discussed, in some embodiments the second surface is treated to facilitate selective deposition of Ge on a metal surface relative to the second surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Ge. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Sb. In some embodiments the hydrophilic surface may be treated to form a silylated surface, such as a silylated —Si—$(CH_3)_x$ or —Si$(CH_3)_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —$SiH_3$ surface. For example, in some embodiments the hydrophilic surface may be contacted with a chemical that provides a H-terminated surface.

As noted above, processes described herein enable use of ALD type deposition techniques to selectively deposit germanium. The ALD type deposition process is mostly surface-controlled (based on controlled reactions at the first substrate surface) and thus has the advantage of providing high conformality at relatively low temperatures. However, in some embodiments, the germanium precursor may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place.

Because of the variability in decomposition temperatures of different compounds, the actual reaction temperature in any given embodiment may be selected based on the specifically chosen precursors. In some embodiments the deposition temperature is below about 600° C. In some embodiments the deposition temperature is below about 500° C. In some embodiments the deposition temperature is below about 450° C. In some embodiments the deposition temperature is preferably below about 400° C. and even, in some cases, below about 375° C.

In some embodiments Ge is selectively deposited on a first surface of a substrate relative to a second, different surface of the substrate by an ALD type process comprising alternately and sequentially contacting the substrate with a first Ge precursor and a second reactant.

Figure 3:
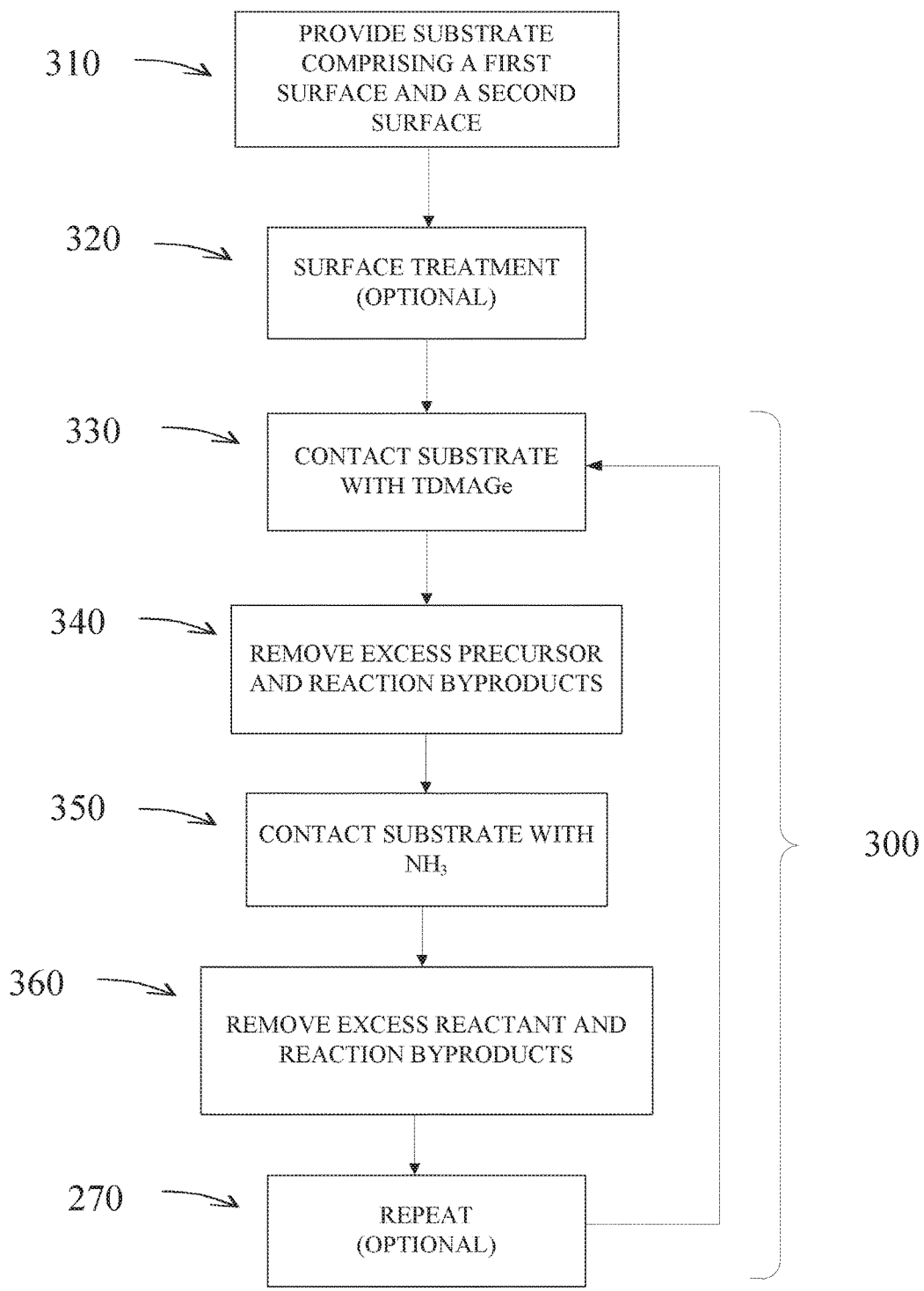
FIG. 3 illustrates a deposition process flow for selectively depositing Ge on a first surface of a substrate relative to a second, different surface of the same substrate.

Referring to FIG. 3 and according to a preferred embodiment a substrate comprising a first surface and a second surface is provided at step 310 and a metal, here Ge, is selectively deposited on a first surface of a substrate by an ALD type deposition process 300 comprising multiple cycles, each cycle comprising:

contacting the surface of a substrate with a vaporized first metal precursor, here TDMAGe, at step 330;

removing excess metal precursor and reaction by products, if any, from the surface at step 340;

contacting the surface of the substrate with a second vaporized reactant, here $NH_3$, at step 350;

removing from the surface, at step 360, excess second reactant and any gaseous by-products formed in the reaction between the metal precursor layer on the first surface of the substrate and the second reactant, and;

repeating at step 370 the contacting and removing steps until a metal, here Ge, thin film of the desired thickness has been formed.

As mentioned above, in some embodiments one or more surfaces of the substrate may be treated in order to enhance deposition on one surface relative to one or more different surfaces prior to beginning the deposition process 300. In FIG. 3 this is indicated by step 320 in which the second, non-metal surface can be treated to provide an OH-terminated surface, or can be deactivated, such as by passivation, prior to deposition of the metal, here Ge.

Although the illustrated Ge deposition cycle begins with contacting the substrate with the first Ge precursor, in other embodiments the deposition cycle begins with contacting the substrate with the second reactant. It will be understood by the skilled artisan that contacting the substrate surface with the first Ge precursor and second reactant are interchangeable in the ALD cycle.

When the Ge precursor contacts the substrate, the Ge precursor may form at least a monolayer, less than a monolayer, or more than a monolayer.

In some embodiments, a carrier gas is flowed continuously to a reaction space throughout the deposition process. In some embodiments in each deposition cycle the first germanium precursor is pulsed into a reaction chamber. In some embodiments excess germanium precursor is then removed from the reaction chamber. In some embodiments, the carrier gas comprises nitrogen. In some embodiments a separate purge gas is utilized.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

The Ge precursor employed in the ALD type processes may be solid, liquid, or gaseous material under standard conditions (room temperature and atmospheric pressure), provided that the Ge precursor is in vapor phase before it is contacted with the substrate surface.

Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. contacting times can be on the order of minutes in some cases. The optimum contacting time can be determined by the skilled artisan based on the particular circumstances. In some embodiments the substrate is moved such that different reactants alternately and sequentially contact the surface of the substrate in a desired sequence for a desired time. In some embodiments the substrate is moved from a first reaction chamber to a second, different reaction chamber. In some embodiments the substrate is moved within a first reaction chamber.

In some embodiments, for example for a 300 mm wafer in a single wafer reactor, the surface of a substrate is contacted with Ge precursor for from about 0.05 seconds to about 10 seconds, for from about 0.1 seconds to about 5 seconds or from about 0.3 seconds to about 3.0 seconds.

The surface of the substrate may be contacted with a second reactant for from about 0.05 seconds to about 10 seconds, from about 0.1 seconds to about 5 seconds, or for from about 0.2 seconds to about 3.0 seconds. However, contacting times for one or both reactants can be on the order of minutes in some cases. The optimum contacting time for each reactant can be determined by the skilled artisan based on the particular circumstances.

As mentioned above, in some embodiments the Ge precursor is a germanium alkoxide, for example $Ge(OEt)_4$ or $Ge(OMe)_4$. In some embodiments, the Ge precursor is TDMAGe. In some embodiments, the Ge precursor includes alkyl and/or alkylamine groups. In some embodiments the Ge-precursor is not a halide. In some embodiments the Ge-precursor may comprise a halogen in at least one ligand, but not in all ligands. The germanium precursor may be provided with the aid of an inert carrier gas, such as argon.

In some embodiments the second reactant comprises a nitrogen-hydrogen bond. In some embodiments the second reactant is ammonia ($NH_3$). In some embodiments, the second reactant is molecular nitrogen. In some embodiments the second reactant is a nitrogen containing plasma. In some embodiments, the second reactant comprises an activated or excited nitrogen species. In some embodiments the second reactant may be a provided in a nitrogen-containing gas pulse that can be a mixture of nitrogen reactant and inactive gas, such as argon.

In some embodiments, a nitrogen-containing plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

Irrespective of the second reactant used, in some embodiments of the present disclosure, the use of a second reactant does not contribute significant amounts of nitrogen to the deposited film. According to some embodiments, the resulting germanium film contains less than about 5-at %, less than about 2-at % or even less than about 1-at % nitrogen. In some embodiments, the nitrogen content of the germanium film is less than about 0.5-at % or even less than about 0.2-at %.

In some embodiments hydrogen reactants are not used in the deposition process. In some embodiments, no elemental hydrogen ($H_2$) is provided in at least one deposition cycle, or in the entire deposition process. In some embodiments, hydrogen plasma is not provided in at least one deposition cycle or in the entire deposition process. In some embodiments, hydrogen atoms or radicals are not provided in at least one deposition cycle, or in the entire deposition process.

In some embodiments the Ge precursor comprises at least one amine or alkylamine ligand, such as those presented in formulas (2) through (6) and (8) and (9), and the second reactant comprises $NH_3$.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. In some embodiments the deposition temperature is selected to be between the temperature where the germanium precursor does not decompose without the second precursor, at the lower end, and the temperature where the precursor does decompose by itself, at the upper end. As discussed elsewhere, in some embodiments the temperature may be less than about 600° C., less than about 450° C., less than about 400° C., and in some cases, less than about 375° C. In some embodiments using $Ge(OCH_2CH_3)_4$ and $NH_3$ as the germanium and second reactants, the temperature is about 350° C.

The processing time depends on the thickness of the layer to be produced and the growth rate of the film. In ALD, the growth rate of a thin film is determined as thickness increase per one cycle. One cycle consists of the contacting and removing steps of the precursors and the duration of one cycle is typically between about 0.2 seconds and about 30 seconds, more preferably between about 1 second and about 10 seconds, but it can be on order of minutes or more in some cases, for example, where large surface areas and volumes are present.

In some embodiments the growth rate of the germanium thin films may be greater than or equal to about 2 Å/cycle, greater than or equal to about 5 Å/cycle, greater than or equal to about 10 Å/cycle, and, in some embodiments, even greater than about 15 Å/cycle.

In some embodiments the germanium film formed is a relatively pure germanium film. Preferably, aside from minor impurities no other metal or semi-metal elements are present in the film. In some embodiments the film comprises less than 1-at % of metal or semi-metal other than Ge. In some embodiments, the germanium film comprises less than about 5-at % of any impurity other than hydrogen, preferably less than about 3-at % of any impurity other than hydrogen, and more preferably less than about 1-at % of any impurity other than hydrogen. In some embodiments a germanium film comprises less than about 5 at-% nitrogen, less than about 3 at-% nitrogen less than about 2 at-% nitrogen or even less than about 1 at-% nitrogen. In some embodiments, a pure germanium film comprises less than about 2-at % oxygen, preferably less than about 1-at % or less than about 0.5-at % and even less than about 0.25-at %.

In some embodiments a germanium precursor comprising oxygen is utilized and the germanium film comprises no oxygen or a small amount of oxygen as an impurity. In some embodiments the germanium film deposited using a germanium precursor comprising oxygen may comprise less than about 2 at-% oxygen, less than about 1 at-%, less than about 0.5 at-% or even less than about 0.25 at-%.

In some embodiments, the germanium film formed has step coverage of more than about 50%, more than about 80%, more than about 90%, or even more than about 95% on structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Ge Precursors

A number of different Ge precursors can be used in the selective deposition processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

In some embodiments the Ge precursor comprises a Ge—O bond. In some embodiments the Ge precursor comprises a Ge—N bond. In some embodiments the Ge precursor comprises a Ge—C bond. In some embodiments the Ge precursor does not comprise Ge—H bond. In some embodiments the Ge precursor comprises equal or less than two Ge—H bonds per one Ge atom.

In some embodiments the Ge precursor is not solid at room temperature (e.g., about 20° C.).

For example, Ge precursors from formulas (1) through (9) below may be used in some embodiments.

$$GeOR_4 \quad (1)$$

Wherein R is can be independently selected from the group consisting of alkyl and substituted alkyl;

$$GeR_xA_{4-x} \quad (2)$$

Wherein the x is an integer from 1 to 4;
R is an organic ligand and can be independently selected from the group consisting of alkoxides, alkylsilyls, alkyl, substituted alkyl, alkylamines; and
A can be independently selected from the group consisting of alkyl, substituted alkyl, alkoxides, alkylsilyls, alkyl, alkylamines, halide, and hydrogen.

$$Ge(OR)_xA_{4-x} \quad (3)$$

Wherein the x is an integer from 1 to 4;
R can be independently selected from the group consisting of alkyl and substituted alkyl; and
A can be independently selected from the group consisting of alkyl, alkoxides, alkylsilyls, alkyl, substituted alkyl, alkylamines, halide, and hydrogen.

$$Ge(NR^IR^{II})_4 \quad (4)$$

Wherein $R^I$ can be independently selected from the group consisting of hydrogen, alkyl and substituted alkyl; and
$R^{II}$ can be independently selected from the group consisting of alkyl and substituted alkyl;

$$Ge(NR^IR^{II})_xA_{4-x} \quad (5)$$

Wherein the x is an integer from 1 to 4;
$R^I$ can be independently selected from the group consisting of hydrogen, alkyl and substituted alkyl; and
$R^{II}$ can be independently selected from the group consisting of alkyl and substituted alkyl;
A can be independently selected from the group consisting of alkyl, alkoxides, alkylsilyls, alkyl, substituted alkyl, alkylamines, halide, and hydrogen.

$$Ge_n(NR^IR^{II})_{2n+2} \quad (6)$$

Wherein the n is an integer from 1 to 3;
$R^I$ can be independently selected from the group consisting of hydrogen, alkyl and substituted alkyl; and
$R^{II}$ can be independently selected from the group consisting of alkyl and substituted alkyl;

$$Ge_n(OR)_{2n+2} \quad (7)$$

Wherein the n is an integer from 1 to 3; and
Wherein R can be independently selected from the group consisting of alkyl and substituted alkyl;

$$Ge_nR_{2n+2} \quad (8)$$

Wherein the n is an integer from 1 to 3; and
R is an organic ligand and can be independently selected from the group consisting of alkoxides, alkylsilyls, alkyl, substituted alkyl, alkylamines.

$$A_{3-x}R_xGe\text{—}GeR_yA_{3-y} \quad (9)$$

Wherein the x is an integer from 1 to 3;
y is an integer from 1 to 3;
R is an organic ligand and can be independently selected from the group consisting of alkoxides, alkylsilyls, alkyl, substituted alkyl, alkylamines; and
A can be independently selected from the group consisting of alkyl, alkoxides, alkylsilyls, alkyl, substituted alkyl, alkylamines, halide, and hydrogen.

Preferred options for R include, but are not limited to, methyl, ethyl, propyl, isopropyl, n-butyl, isobutyl, tertbutyl for all formulas, more preferred in ethyl and methyl. In some embodiments, the preferred options for R include, but are not limited to, $C_3$-$C_{10}$ alkyls, alkenyls, and alkynyls and substituted versions of those, more preferably $C_3$-$C_6$ alkyls, alkenyls, and alkenyls and substituted versions of those.

In some embodiments the Ge precursor comprises one or more halides. For example, the precursor may comprise 1, 2, or 3 halide ligands. However, as mentioned above, in some embodiments the Ge precursor does not comprise a halide.

In some embodiments a germane ($GeH_x$) is not used. In some embodiments a compound comprising Ge and hydrogen may be used. In some embodiments a germane may be used, including, but not limited to, one or more of $GeH_4$ and $Ge_2H_6$.

In some embodiments alkoxide Ge precursors may be used, including, but not limited to, one or more of $Ge(OMe)_4$, $Ge(OEt)_4$, $Ge(O^iPr)_4$, $Ge(O^nPr)_4$ and $Ge(O^tBu)_4$. In some embodiments the Ge precursor is TDMAGe. In some embodiments the Ge precursor is TDEAGe. In some embodiments the Ge precursor is TEMAGe.

Selective Deposition of Metal or Metal Oxide on Dielectric

As mentioned above, in some embodiments a metal or metal oxide material is selectively deposited on a first hydrophilic surface of a substrate relative to a second, different surface, such as a conductive surface, metal surface, or H-terminated surface of the same substrate.

In some embodiments metal or metal oxide deposition on the first surface of the substrate relative to the second surface of the substrate is at least about 90% selective, at least about 95% selective, at least about 96%, 97%, 98% or 99% or greater selective. In some embodiments metal or metal oxide deposition only occurs on the first surface and does not occur on the second surface. In some embodiments metal or metal oxide deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is treated, or deactivated, to inhibit deposition of a metal or metal oxide thereon. For example, a metal surface may be treated by oxidation to provide a metal oxide surface. In some embodiments a Cu, Ru, Al, Ni, Co, or other noble metal surface is oxidized to facilitate selective deposition on a dielectric surface relative to the Cu, Ru, Al, Ni, Co, or other noble metal surface. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second surface is not a hydrophilic surface. In some embodiments a hydrophilic surface may be treated so that it is no longer a hydrophilic surface. In some embodiments the second surface is a Si surface. In some embodiments the second surface is an H-terminated surface. In some embodiments the second surface is treated, for example by contacting with a chemical that provides a —SiH3 terminated surface. In some embodiments a Si surface is treated prior to deposition of a metal or metal oxide on a first surface.

In some embodiments the second, metal, surface is oxidized prior to deposition of a metal or metal oxide on a first surface. In some embodiments the second, metal, surface is oxidized at the beginning of the deposition process, for example, during the first phase of a deposition cycle. In some embodiments the second, metal, surface is oxidized prior to the first phase of a deposition cycle.

In some embodiments the second surface may be passivated to inhibit deposition thereon. In some embodiments, for example, the second surface may be passivated with alkylsilyl-groups. For example, in some embodiments a second surface is passivated such that it comprises alkylsilyl-groups, in order to facilitate selective deposition on a dielectric surface relative to the second surface. The passivation may facilitate selective deposition on the dielectric surface relative to a treated metal surface. For example, deposition of an oxide on the metal surface may be inhibited by the passivation. In some embodiments passivation does not include formation of a SAM or a similar monolayer having a long carbon chain on the metal surface.

In some embodiments the material selectively deposited on a first surface of a substrate relative to a second surface is a metal. In some embodiments the material selectively deposited on a first surface of a substrate relative to a second surface is a metal oxide. In some embodiments the metal selectively deposited is Fe. In some embodiments the metal oxide selectively deposited is a Ni, Fe, or Co oxide. In some embodiments the metal selectively deposited is Ni. In some embodiments the metal selectively deposited is Co. In some embodiments selective deposition of a metal oxide may be achieved by oxidation of a selectively deposited metal. In some embodiments a metal is first selectively deposited and subsequently oxidized to form a metal oxide. In some embodiments a metal is not oxidized after being selectively deposited.

ALD type selective deposition processes, such as the process as shown in FIG. 1 and described above can be used to selectively deposit a metal or metal oxide on a first surface of a substrate relative to a second surface. In some embodiments the first precursor is a first metal precursor. In some embodiments the first precursor is a first metal oxide precursor. In some embodiments the second reactant comprises an oxygen source. In some embodiments the second reactant comprises an oxygen source as described herein in relation to selective deposition of a dielectric on a dielectric.

Suitable nickel precursors may be selected by the skilled artisan. In general, nickel compounds where the metal is bound or coordinated to oxygen, nitrogen, carbon or a combination thereof are preferred. In some embodiments the nickel precursors are organic compounds. In some embodiments the nickel precursor is a metalorganic compound. In some embodiments the nickel precursor is a metal organic compound comprising bidentate ligands. In some embodiments the nickel precursor is bis(4-N-ethylamino-3-penten-2-N-ethyliminato)nickel (ii).

In some embodiments, nickel precursors can be selected from the group consisting of nickel betadiketonate compounds, nickel betadiketiminato compounds, nickel aminoalkoxide compounds, nickel amidinate compounds, nickel cyclopentadienyl compounds, nickel carbonyl compounds and combinations thereof. In some embodiments, X(acac)y or X(thd)y compounds are used, where X is a metal, y is generally, but not necessarily between 2 and 3 and thd is 2,2,6,6-tetramethyl-3,5-heptanedionato. Some examples of suitable betadiketiminato (e.g., Ni(pda)2) compounds are mentioned in U.S. Patent Publication No. 2009-0197411 A1, the disclosure of which is incorporated herein in its entirety. Some examples of suitable amidinate compounds (e.g., Ni(iPr-AMD)2) are mentioned in U.S. Patent Publication No. 2006-0141155 A1, the disclosure of which is incorporated herein in its entirety.

The nickel precursor may also comprise one or more halide ligands. In preferred embodiments, the precursor is nickel betadiketiminato compound, such bis(4-N-ethyl-amino-3-penten-2-N-ethyliminato)nickel (II) [Ni(EtN-EtN-pent)2], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as Ni(acac)2,Ni(thd)2 or nickel cyclopentadienyl compounds, such Ni(cp)2, Ni(Mecp)2, Ni(Etcp)2 or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments the first Ni precursor is bis(4-N-ethylamino-3-penten-2-N-ethyliminato)nickel (II).

In some embodiments the first precursor used in a selective deposition process for depositing Co or Co oxide on a first surface of a substrate relative to a second surface is a Co precursor. In some embodiments the Co precursor is a Co beta-diketoiminato compound. In some embodiments the Co precursor is a Co ketoiminate compound. In some embodiments the Co precursor is a Co amidinate compound. In some embodiments the Co precursor is a Co beta-diketonate compound. In some embodiments the Co precursor contains at least one ketoimine ligand or a derivative thereof. In some embodiments the Co precursor contains at least one amidine ligand or a derivative thereof. In some embodiments the Co precursor contains at least one ketonate ligand or a derivative thereof.

In some embodiments the first precursor used in a selective deposition process for depositing Fe or Fe oxide on a first surface of a substrate relative to a second surface is a Fe precursor. In some embodiments the Fe precursor is $Cp_2Fe$ or derivative thereof. In some embodiments the Fe precursor contains at least one cyclopentadienyl ligand (Cp), substituted cyclopentadienyl ligand or a derivative thereof. In some embodiments the Fe precursor contains at least one carbonyl ligand (—CO) or a derivative thereof. In some embodiments the Fe precursor contains at least one carbonyl ligand (—CO) and at least one organic ligand, such as a cyclopentadienyl ligand (Cp) or a substituted cyclopentadienyl ligand or a derivative thereof. In some embodiments the Fe precursor is $Fe(acac)_2$. In some embodiments the Fe precursor is Fe-alkoxide, such as iron(III) tert-butoxide $(Fe_2(O^tBu)_6)$. In some embodiments the Fe precursor is $Fe(CO)_5$.

In some embodiments the second reactant in an ALD process for selectively depositing a metal or metal oxide is selected from hydrogen and forming gas. In other embodiments the second reactant may be an alcohol, such as EtOH.

In some embodiments the second reactant is an organic reducing agent. The organic reducing agents preferably have at least one functional group selected from the group consisting of alcohol (—OH), as mentioned above, or aldehyde (—CHO), or carboxylic acid (—COOH).

Reducing agents containing at least one alcohol group may be selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

R1-OH (I)

wherein R1 is a linear or branched C1-C20 alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$\text{R1}-\underset{\underset{\text{OH}}{|}}{\text{CH}}-\text{R1} \qquad (II)$$

wherein each R1 is selected independently from the group of linear or branched C1-C20 alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$\text{R1}-\underset{\underset{\text{R1}}{|}}{\overset{\overset{\text{OH}}{|}}{\text{C}}}-\text{R1} \qquad (III)$$

wherein each R1 is selected independently from the group of linear or branched C1-C20 alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

CH$n$X3-$n$-R2-OH (IV)

wherein X is selected from the group consisting of F, Cl, Br and I, n is an integer from 0 to 2 and R2 is selected from the group of linear or branched C1-C20 alkyl and alkenyl groups, preferably methyl, ethyl, propyl, butyl, pentyl or hexyl. More preferably X is selected from the group consisting of F and Cl and R2 is selected from the group consisting of methyl and ethyl. An example of a preferred halogenated alcohol is 2,2,2-trifluoroethanol.

Other derivatives of alcohols that may be used include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in some embodiments reducing agents are aldehydes having the general formula (V):

R3-CHO (V)

wherein R3 is selected from the group consisting of hydrogen and linear or branched C1-C20 alkyl and alkenyl groups, preferably methyl, ethyl, propyl, butyl, pentyl or hexyl. More preferably, R3 is selected from the group consisting of methyl or ethyl. Examples of preferred compounds according to formula (V) are formaldehyde, acetaldehyde and butyraldehyde.

In other embodiments reducing agents are aldehydes having the general formula (VI):

OHC—R4-CHO (VI)

wherein R4 is a linear or branched C1-C20 saturated or unsaturated hydrocarbon. Alternatively, the aldehyde groups may be directly bonded to each other (R4 is null).

Reducing agents containing at least one —COOH group may be selected from the group consisting of compounds of the general formula (VII), polycarboxylic acids, halogenated carboxylic acids and other derivatives of carboxylic acids.

Thus, in some embodiment preferred reducing agents are carboxylic acids having the general formula (VII):

R5-COOH (VII)

wherein R5 is hydrogen or linear or branched C1-C20 alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

Selective Deposition of Dielectric on Dielectric

As mentioned above, in some embodiments a dielectric material is selectively deposited on a first dielectric surface of a substrate relative to a second, different surface, such as a conductive surface, metal surface, or H-terminated surface of the same substrate.

In some embodiments dielectric deposition on the first surface of the substrate relative to the second surface of the substrate is at least about 90% selective, at least about 95% selective, at least about 96%, 97%, 98% or 99% or greater selective. In some embodiments dielectric deposition only occurs on the first surface and does not occur on the second surface. In some embodiments dielectric deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is treated, or deactivated, to inhibit deposition of a dielectric thereon. For example, a metal surface may be treated by oxidation to provide a metal oxide surface. In some embodiments a Cu, Ru, Al, Ni, Co, or other noble metal surface is oxidized to facilitate selective deposition on a dielectric surface relative to the Cu, Ru, Al, Ni, Co, or other noble metal surface. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal.

In some embodiments the conductive surface comprises an oxide such as $CuO_x$, $NiO_x$, $CoO_x$ or $RuO_x$ or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is oxidized prior to deposition of a dielectric on a first surface. In some embodiments the second, metal, surface is oxidized at the beginning of the deposition process, for example, during the first phase of a deposition cycle. In some embodiments the second, metal surface is oxidized prior to the first phase of a deposition cycle. In some embodiments the second, metal, surface is purposefully oxidized with an oxygen source. In some embodiments the second, metal, surface is oxidized in the ambient air and/or contains native oxide. In some embodiments the second, metal surface contains an oxide which has been deposited.

In some embodiments the second surface may be passivated to inhibit deposition thereon. In some embodiments, for example, the second surface may be passivated with alkylsilyl-groups. For example, in some embodiments a second surface is passivated such that it comprises alkylsilyl-groups, in order to facilitate selective deposition on a dielectric surface relative to the second surface. The passivation may facilitate selective deposition on the dielectric surface relative to the treated metal surface. For example, deposition of an oxide on the first metal surface may be inhibited by the passivation. In some embodiments passivation does not include formation of a SAM or a similar monolayer having a long carbon chain on the metal surface.

Selective Deposition of $GeO_2$ on Dielectric $GeO_2$ may be deposited by an ALD type process on a first dielectric surface of a substrate relative to a second, different surface of the same substrate. In some embodiments the second surface may be a conductive surface, a metal surface, or an H-terminated surface. In some embodiments the $GeO_2$ is deposited by a method as described in U.S. application Ser. No. 13/802,393, filed Mar. 13, 2013, which is hereby incorporated by reference. In some embodiments the dielectric surface is a hydrophilic OH-terminated surface. For example, the dielectric surface can be a $SiO_2$ surface, a low-k surface, preferably comprising OH-groups, or a $GeO_2$ surface. The second surface may be, for example, a Cu, Ru, Al, Ni, Co, or other noble metal surface. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. As discussed above, in some embodiments a dielectric surface may be treated to increase the amount of OH-groups on the surface. In some embodiments the second surface may be an oxide. In some embodiments the second surface may be a metal surface that has been oxidized.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

As previously discussed, in some embodiments, the metal surface is oxidized prior to deposition in order to facilitate selective deposition of $GeO_2$ on the dielectric surface relative to the metal surface. In some embodiments a second reactant in a selective deposition process may serve to oxidize the metal surface. Thus, in some embodiments the second reactant is provided first in the initial ALD cycle, or prior to the first ALD cycle. In some embodiments the metal surface is oxidized prior to beginning the selective deposition process.

In some embodiments the metal surface is passivated prior to deposition in order to facilitate selective deposition of $GeO_2$ on the dielectric surface relative to the metal surface. For example, the metal surface can be provided with alkylsilyl groups.

In some embodiments GeO2 deposition on the first surface of the substrate relative to the second surface of the substrate is at least about 90% selective, at least about 95% selective, at least about 96%, 97%, 98% or 99% or greater selective. In some embodiments $GeO_2$ deposition only occurs on the first surface and does not occur on the second surface. In some embodiments $GeO_2$ deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

Figure 4:
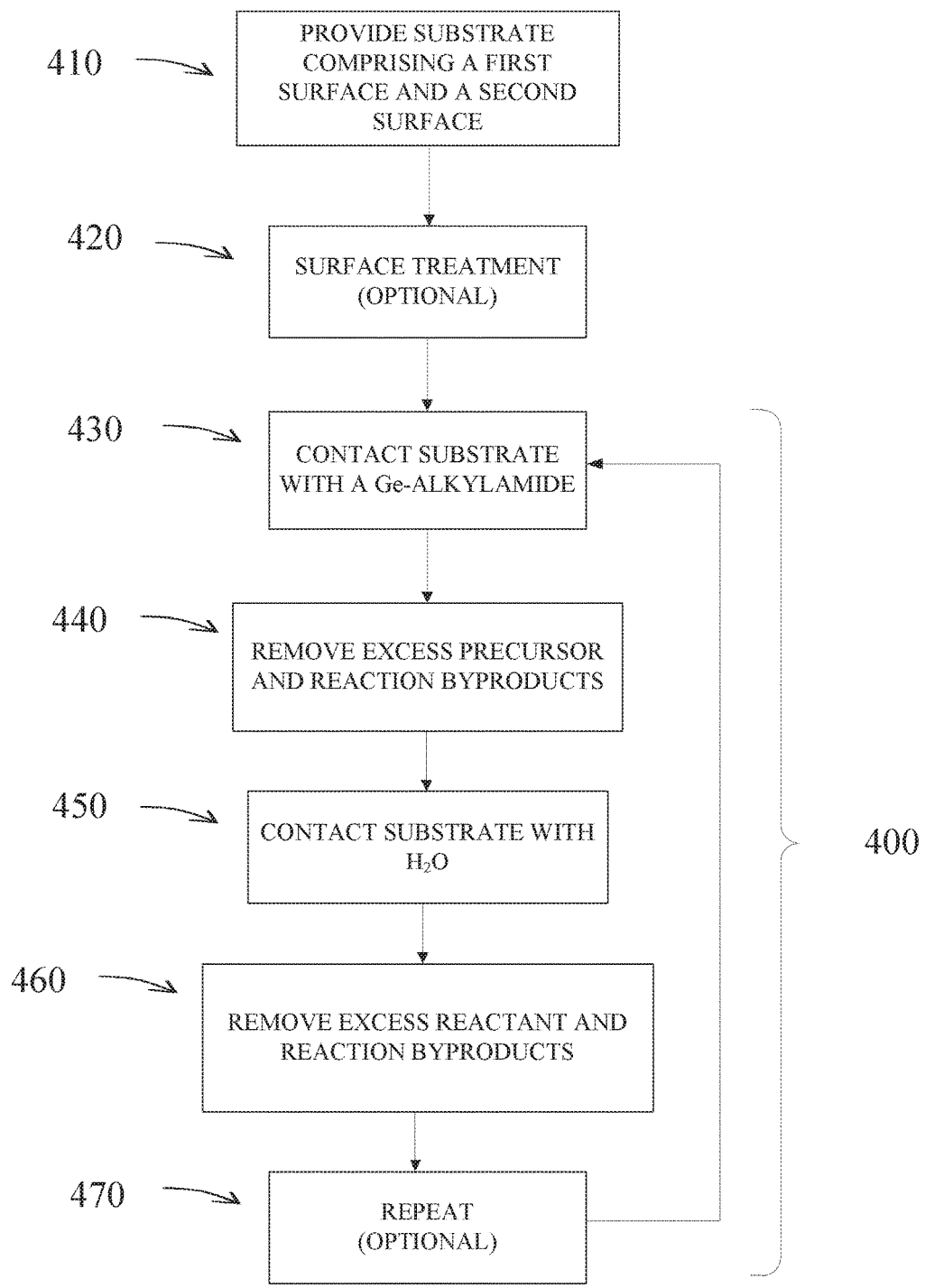
FIG. 4 illustrates a deposition process flow for selectively depositing $GeO_2$ on a first surface of a substrate relative to a second, different surface of the same substrate.

Referring to FIG. 4 and according to a preferred embodiment a substrate comprising a first surface and a second surface is provided at step 410 and a dielectric, here $GeO_2$, is selectively deposited on a first surface of a substrate by an ALD-type process comprising multiple cycles, each cycle 400 comprising:

contacting the surface of a substrate with a vaporized first precursor, here a Ge-alkylamide, at step 430;

removing excess first precursor and reaction by products, if any, from the surface at step 440;

contacting the surface of the substrate with a second vaporized reactant, here $H_2O$ at step 450;

removing from the surface, at step 460, excess second reactant and any gaseous by-products formed in the reaction between the first precursor layer on the first surface of the substrate and the second reactant, and;

repeating, at step 470, the contacting and removing steps until a dielectric, here $GeO_2$, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process 400. In FIG. 4 this is indicated by step 420 in which the second, metal surface is deactivated, such as by passivation or oxidation prior to the deposition of the dielectric, here $GeO_2$.

In some embodiments germanium oxide, preferably $GeO_2$, is deposited from alternately and sequentially contacting the substrate with a Ge precursor and a second reactant, such as water, ozone, oxygen plasma, oxygen radicals, or oxygen atoms. In some embodiments the second reactant is not water. The Ge precursor preferably comprises Ge(OEt)4 or TDMAGe.

The Ge precursor employed in the ALD type processes may be solid, liquid, or gaseous material under standard conditions (room temperature and atmospheric pressure), provided that the Ge precursor is in vapor phase before it is contacted with the substrate surface. Contacting the surface of a substrate with a vaporized precursor means that the precursor vapor is in contact with the surface of the substrate for a limited period of time. Typically, the contacting time is from about 0.05 seconds to about 10 seconds. However, depending on the substrate type and its surface area, the contacting time may be even higher than about 10 seconds.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

Preferably, for a 300 mm wafer in a single wafer ALD reactor, the substrate surface is contacted with a Ge precursor for from about 0.05 seconds to about 10 seconds, more preferably for from about 0.1 seconds to about 5 seconds and most preferably for from about 0.3 seconds to about 3.0 seconds. The substrate surface is contacted with the second precursor preferably for from about 0.05 seconds to about 10 seconds, more preferably for from about 0.1 seconds to about 5 seconds, most preferably for from about 0.2 seconds to about 3.0 seconds. However, contacting times can be on the order of minutes in some cases. The optimum contacting time can be readily determined by the skilled artisan based on the particular circumstances.

As mentioned above, in some embodiments the Ge precursor is $Ge(OEt)_4$ or TDMAGe. Other possible germanium precursors that can be used in some embodiments are described below. In some embodiments, the Ge precursor is $Ge(OMe)_4$. In some embodiments the Ge-precursor is not a halide. In some embodiments the Ge-precursor may comprise a halogen in at least one ligand, but not in all ligands.

In certain preferred embodiments $GeO_2$ is selectively deposited on a first surface of a substrate relative to a second, different surface of the substrate by an ALD type process, comprising multiple cycles, each cycle comprising alternately and sequentially contacting the substrate with vapor phase Ge— alkylamide and a second reactant comprising water.

In certain preferred embodiments GeO$_2$ is selectively deposited on a first surface of a substrate relative to a second, different surface of the substrate by an ALD type process, comprising multiple cycles, each cycle comprising alternately and sequentially contacting the substrate with a vapor phase Ge precursor with the formula Ge(NR$^I$R$^{II}$)$_4$, and a second reactant comprising water, wherein R$^I$ can be independently selected from the group consisting of hydrogen, alkyl and substituted alkyl, wherein R$^I$ can be preferably independently selected from the group consisting of C1-C3 alkyls, such as methyl, ethyl, n-propyl, and i-propyl, most preferably methyl or ethyl; and wherein R$^{II}$ can be independently selected from the group consisting of alkyl and substituted alkyl, wherein R$^{II}$ can be preferably independently selected from the group consisting of C1-C3 alkyls, such as methyl, ethyl, n-propyl, and i-propyl, most preferably methyl or ethyl.

The second reactant may be an oxygen-containing gas pulse and can be a mixture of oxygen and inactive gas, such as nitrogen or argon. In some embodiments the second reactant may be a molecular oxygen-containing gas. The preferred oxygen content of the second reactant gas is from about 10% to about 25%. Thus, in some embodiments the second reactant may be air. In some embodiments, the second reactant is molecular oxygen. In some embodiments, the second reactant comprises an activated or excited oxygen species. In some embodiments, the second reactant comprises ozone. The second reactant may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the second reactant is oxygen plasma.

In some embodiments, the surface of the substrate is contacted with ozone or a mixture of ozone and another gas. In other embodiments, ozone is formed inside a reactor, for example by conducting oxygen containing gas through an arc. In other embodiments, an oxygen containing plasma is formed in a reactor. In some embodiments, a plasma may be formed in situ on top of the substrate or in close proximity to the substrate. In other embodiments, a plasma is formed upstream of a reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

In some embodiments the second reactant is a second reactant other than water. Thus, in some embodiments water is not provided in any ALD cycle for selectively depositing GeO$_2$.

A number of different Ge precursors can be used in the selective deposition processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

For example, Ge precursors from formulas (1) through (9), as previously discussed above, may be used in some embodiments.

In some embodiments the Ge precursor comprises at least one amine or alkylamine ligand, such as those presented in formulas (2) through (6) and (8) and (9), and the oxygen precursor comprises water.

In some embodiments the Ge precursor comprises at least one alkoxy, amine or alkylamine ligand. In some embodiments the GeO$_2$ is deposited by an ALD process using water and a Ge-alkylamine precursor. In some embodiments the Ge precursor is Ge(NMe$_2$)$_4$ or Ge(NEt$_2$)$_4$ or Ge(NEtMe)$_4$.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on.

The processing time depends on the thickness of the layer to be produced and the growth rate of the film. In ALD, the growth rate of a thin film is determined as thickness increase per one cycle. One cycle consists of the contacting and removing steps of the precursors and the duration of one cycle is typically between about 0.2 seconds and about 30 seconds, more preferably between about 1 second and about 10 seconds, but it can be on order of minutes or more in some cases, for example, where large surface areas and volumes are present.

In some embodiments the GeO$_2$ film formed is a pure GeO$_2$ film. Preferably, aside from minor impurities no other metal or semi-metal elements are present in the film. In some embodiments the film comprises less than 1-at % of metal or semi-metal other than Ge. In some embodiments the GeO$_2$ film is stoichiometric. In some embodiments, a pure GeO$_2$ film comprises less than about 5-at % of any impurity other than hydrogen, preferably less than about 3-at % of any impurity other than hydrogen, and more preferably less than about 1-at % of any impurity other than hydrogen.

In some embodiments, the GeO$_2$ film formed has step coverage of more than about 80%, more preferably more than about 90%, and most preferably more than about 95% in structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Selective Deposition of SiO$_2$ on Dielectric

SiO$_2$ may be deposited by an atomic layer deposition type process on a first dielectric surface of a substrate relative to a second surface of the same substrate. In some embodiments the dielectric surface is a hydrophilic OH-terminated surface. For example, the dielectric surface can be a SiO$_2$ surface, a low-k surface, preferably comprising OH-groups, or GeO$_2$ surface. In some embodiments the second surface may be a conductive surface, a metal surface, or a H-terminated surface. The second surface may be, for example, a Cu, Ru, Al, Ni, Co, or other noble metal surface. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. As discussed above, in some embodiments a dielectric surface may be treated to increase the amount of OH-groups on the surface.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

In some embodiments $SiO_2$ deposition on the first surface of the substrate relative to the second surface of the substrate is at least about 90% selective, at least about 95% selective, at least about 96%, 97%, 98% or 99% or greater selective. In some embodiments $SiO_2$ deposition only occurs on the first surface and does not occur on the second surface. In some embodiments $SiO_2$ deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In a preferred embodiment $SiO_2$ is selectively deposited by an ALD type process using an aminosilane as the Si precursor and ozone as the second reactant. In some embodiments the $SiO_2$ is deposited by an ALD process using ozone and an aminosilane, such as bis(diethylamino)silane precursor. Such methods are known in the art and can be adapted to deposit selectively on the dielectric material relative to a metal.

In some embodiments, the metal surface is oxidized prior to deposition in order to facilitate selective deposition of $SiO_2$ on the dielectric surface relative to the metal surface. In some embodiments an oxygen source in a selective deposition process may serve to oxidize the metal surface. Thus, in some embodiments the second reactant is provided first in the initial ALD cycle, or prior to the first ALD cycle. In some embodiments the metal surface is oxidized prior to beginning the selective deposition process.

In some embodiments the metal surface is passivated prior to deposition in order to facilitate selective deposition of $SiO_2$ on the dielectric surface relative to the metal surface. For example, the metal surface can be provided with alkylsilyl groups.

Figure 5:
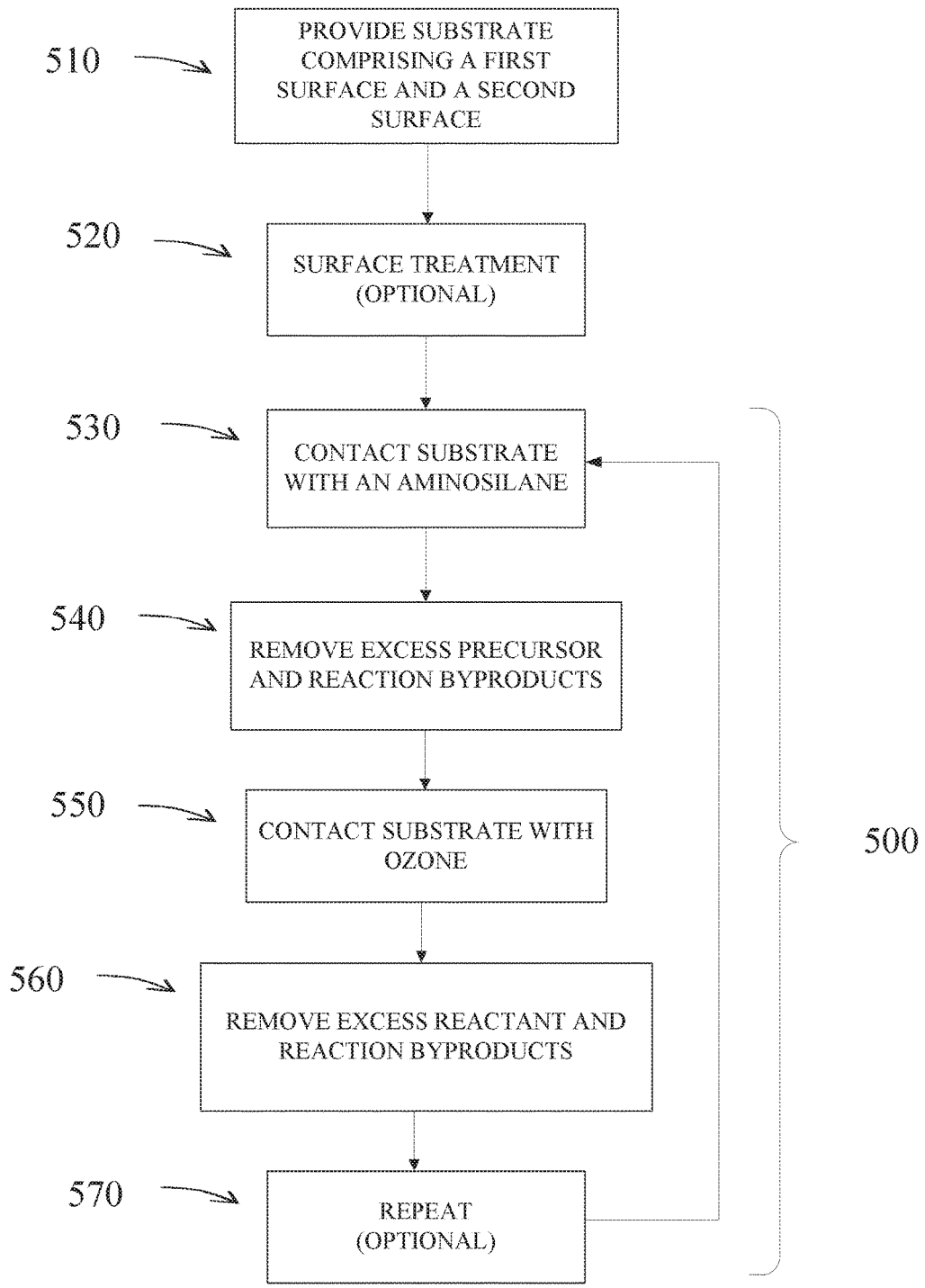
FIG. 5 illustrates a deposition process flow for selectively depositing $SiO_2$ on a first surface of a substrate relative to a second, different surface of the same substrate.

Referring to FIG. 5 and according to a preferred embodiment a substrate comprising a first surface and a second surface is provided at step 510 and a dielectric, here $SiO_2$, is selectively deposited on a first surface of a substrate by an ALD-type process comprising multiple cycles, each cycle 500 comprising:

contacting the surface of a substrate with a vaporized first precursor, here an aminosilane, at step 530;

removing excess first precursor and reaction by products, if any, from the surface at step 540;

contacting the surface of the substrate with a second vaporized reactant, here ozone, at step 550;

removing from the surface, at step 560, excess second reactant and any gaseous by-products formed in the reaction between the first precursor layer on the first surface of the substrate and the second reactant, and;

repeating, at step 570, and removing steps until a dielectric, here $SiO_2$, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process 500. In FIG. 5 this is indicated by step 520 in which the second, metal surface is deactivated, such as by passivation or oxidation prior to the deposition of the dielectric, here $SiO_2$.

In some embodiments the deposition process 500 is operated at a temperature lower than 450° C. In some embodiments the deposition process if operated at 400° C. In some embodiments the entire deposition process is carried out at the same temperature.

In some embodiments the $SiO_2$ selective deposition can be carried out at a wide range of pressure conditions, but it is preferred to operate the process at reduced pressure. The pressure in a reaction chamber is typically from about 0.01 to about 500 mbar or more. However, in some cases the pressure will be higher or lower than this range, as can be readily determined by the skilled artisan. The pressure in a single wafer reactor is preferably maintained between about 0.01 mbar and 50 mbar, more preferably between about 0.1 mbar and 10 mbar. The pressure in a batch ALD reactor is preferably maintained between about 1 mTorr and 500 mTorr, more preferably between about 30 mTorr and 200 mTorr.

In some embodiments the $SiO_2$ deposition temperature is kept low enough to prevent thermal decomposition of the gaseous source chemicals. On the other hand, the deposition temperature is kept high enough to provide activation energy for the surface reactions, to prevent the physisorption of source materials and minimize condensation of gaseous reactants in the reaction space. Depending on the reactants and reactors, the deposition temperature is typically about 20° C. to about 500° C., preferably about 150° C. to about 350° C., more preferably about 250° C. to about 300° C.

The silicon source temperature is preferably set below the deposition or substrate temperature. This is based on the fact that if the partial pressure of the source chemical vapor exceeds the condensation limit at the substrate temperature, controlled layer-by-layer growth of the thin film is compromised. In some embodiments, the silicon source temperature is from about 30 to about 150° C. In some embodiments the silicon source temperature is greater than about 60° C. during the deposition. In some embodiments, where greater doses are needed, for example in batch ALD, the silicon source temperature is from about 90° C. to about 200° C., preferably from about 130° C. to about 170° C.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments $SiO_2$ is selectively deposited using an ALD type process as described herein.

In some embodiments the growth rate of the thin film comprising silicon dioxide is preferably above 0.7 Å/cycle. In other embodiments the growth rate is above 0.8 Å/cycle and in still other embodiments the growth rate is above 1.0 Å/cycle, and preferably in the range of 1.0 to 1.2 Å/cycle.

In some embodiments the selectively deposited silicon dioxide has less than 2 at-% of nitrogen as an impurity. In other embodiments the $SiO_2$ comprise less than 1 at-% of nitrogen, or even less than 0.5 at-% nitrogen as an impurity. Similarly, in some embodiments the $SiO_2$ comprise less than 1 at-% carbon as an impurity and in some cases less than 0.5 at-% carbon as an impurity.

In some embodiments the selectively deposited silicon oxide has a step coverage of more than 80%, in other embodiments preferably more than 90% and in other embodiments preferably more than 95%.

In certain preferred embodiments $SiO_2$ is selectively deposited on a first surface of a substrate relative to a second, different surface of the substrate by an ALD type process, comprising multiple cycles, each cycle comprising alternately and sequentially contacting the substrate with vapor phase BDEAS and a second reactant comprising ozone.

Si Precursors

In some embodiments the silicon precursor can comprise silane, siloxane, or silazane compounds. In some embodiments the $SiO_2$ is deposited using precursors as described in U.S. Pat. No. 7,771,533, which is hereby incorporated by reference. For example, the Si precursor from the formulas (1) through (3) below may be used in some embodiments.

$$Si_mL_{2m+2} \quad (1)$$

$$Si_yO_{y-1}L_{2y+2} \quad (2)$$

$$Si_yNH_{y-1}L_{2y+2} \quad (3)$$

Wherein L can be independently selected from the group consisting of F, Cl, Br, I, alkyl, aryl, alkoxy, vinyl, cyano, amino, silyl, alkylsilyl, alkoxysilyl, silylene an alkylsiloxane. In some embodiments alkyl and alkoxy groups can be linear or branched and contain at least one substituent. In some embodiments alkyl and alkoxy groups contain 1-10 carbon atoms, preferably 1-6 carbon atoms.

In some embodiments the silicon precursor can preferably comprise amino-substituted silanes and silazanes, such as 3-aminoalkyltrialkoxy silanes, for example 3-aminopropyltriethoxy silane $NH_2$—$CH_2CH_2CH_2$—$Si(O$—$CH_2CH_3)_3$ (AMTES) and 3-aminopropyltrimethoxy silane ($NH_2$—$CH_2CH_2CH_2$—$Si(O$—$CH_3)_3$(AMTMS) and hexaalkyldisilazane $(CH_3)_3Si$—$NH$—$Si(CH_3)_3$(HMDS).

In some embodiments the $SiO_2$ is deposited using precursors as described in U.S. Pat. No. 8,501,637 which is hereby incorporated by reference. In some embodiments, the silicon precursor is preferably a disilane and has a Si—Si bond. Organic compounds having a Si—Si bond and an $NH_x$ group either attached directly to silicon (to one or more silicon atoms) or to a carbon chain attached to silicon are used in some embodiments. In some embodiments organosilicon compounds are used, which may or may not comprise Si—Si bonds. More preferably the silicon compound has the formula:

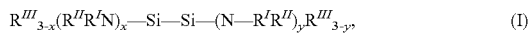

wherein, x is selected from 1 to 3;

y is selected from 1 to 3;

$R^I$ is selected from the group consisting of hydrogen, alkyl, and substituted alkyl;

$R^{II}$ is selected from the group consisting of alkyl and substituted alkyl; and $R^{III}$ is selected from the group consisting of hydrogen, hydroxide (—OH), amino (—$NH_2$), alkoxy, alkyl, and substituted alkyl;

and wherein the each x, y, $R^{III}$, $R^{II}$ and $R^I$ can be selected independently from each other.

In some embodiments the silicon compound is hexakis (monoalkylamino)disilane:

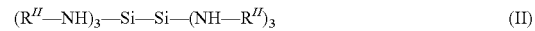

In other embodiments the silicon compound is hexakis (ethylamino)disilane:

In other embodiments the silicon compound is

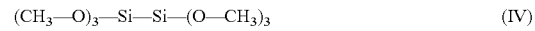

In some embodiments, the silicon compound is hexakis (monoalkylamino)disilane $(R^{II}$—$NH)_3$—Si—Si—$(NH$—$R^{II})_3$ and $R^{II}$ is selected from the group consisting of alkyl and substituted alkyl.

In some embodiments the $SiO_2$ is deposited using precursors as described in U.S. Publication No. 2009/0232985 which is hereby incorporated by reference. In some embodiments the deposition temperature can be as low as room temperature and up to 500° C., with an operating pressure of 0.1-100 Torr (13 to 13300 Pa). High quality films, with very low carbon and hydrogen contents, are preferably deposited between 200 and 400° C. at a pressure between 0.1-10 Torr (13 to 1330 Pa).

In some embodiments the Si precursor can comprise less than 100 ppm of $H_2$ and can be selected from the group consisting of:

DSO Disiloxane $(SiH_3)_2O$
Bis(diethylamino)silane $SiH_2(NEt_2)_2$
BDMAS Bis(dimethylamino)silane $SiH_2(NMe_2)_2$
TriDMAS Tris(diethylamino)silane $SiH(NMe_2)_3$
Bis(trimethylsilylamino)silane $SiH_2(NHSiMe_3)_2$
TEAS Tetrakis(ethylamino)silane $Si(NHEt)_4$
TEOS Tetrakis(ethoxy)silane $Si(OEt)_4$
BTESE Bis(triethoxysilyl)ethane $(EtO)_3Si$—$CH_2$—$CH_2$—$Si(OEt)_3$ In some embodiments the Si precursor is an aminosilane of the general formula $(R1R2N)nSiH_{4-x}$, where x is comprised between 1 and 4, where R1 and R2 are independently H or a C1-C6 linear, branched or cyclic carbon chains. Preferably the Si precursor is an aminosilane of the general formula $(R1R2N)nSiH_2$, where R1 and R2 are preferably independently selected from C1-C4 linear, branched or cyclic carbon chains.[0275] In some embodiments the alkylaminosilane is bis(diethylamino)silane (BDEAS), bis(dimethylamino)silane (BDMAS) or tris(dimethylamino)silane (TriDMAS).

In some embodiments the Si precursor is a silane (silane, disilane, trisilane, trisilylamine) of the general formula $(SiH_3)xR$ where may vary from 1 to 4 and wherein R is selected from the comprising H, N, O, $CH_2$, $CH_2$—$CH_2$, $SiH_2$, SiH, Si with the possible use of a catalyst in ALD regime. Preferably the silane is a C-free silane. Most preferably, the silane is trisilylamine. In some embodiments a very small amount (<1%) of catalyst may introduced into the reactor. The silanes described above can be difficult to use in ALD conditions, as their adsorption on a silicon wafer is not favorable. In some embodiments the use of a catalyst helps the adsorption of silane on the first surface of the substrate or the underlying layer. In some embodiments, the introduction of the catalyst is simultaneous with the silane. In some embodiments the catalyst is an amine or a metal-containing molecule, preferably a molecule containing an early transition metal, most preferably a hafnium-containing molecule, such as Hf(NEt$_2$)4. In some embodiments, the catalyst is C-free.

In some embodiments the SiO$_2$ is deposited using precursors as described in U.S. Publication No. 2007/0275166 which is hereby incorporated by reference.

In some embodiments the Si precursor used in the selective deposition process is an organoaminosilane precursor and it is represented by formula A as follows:

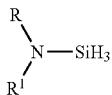

A

In this class of compounds R and R$^1$ are selected from the group consisting of C$_2$-C$_{10}$ alkyl groups, linear, branched, or cyclic, saturated or unsaturated, aromatic, alkylamino groups, heterocyclic, hydrogen, silyl groups, with or without substituents, and R and R$^1$ also being combinable into a cyclic group. Representative substituents are alkyl groups and particularly the C$_{1-4}$ alkyl groups, such as ethyl, propyl and butyl, including their isomeric forms, cyclic groups such as cyclopropyl, cyclopentyl, and cyclohexyl. Illustrative of some of the preferred compounds within this class are represented by the formulas:

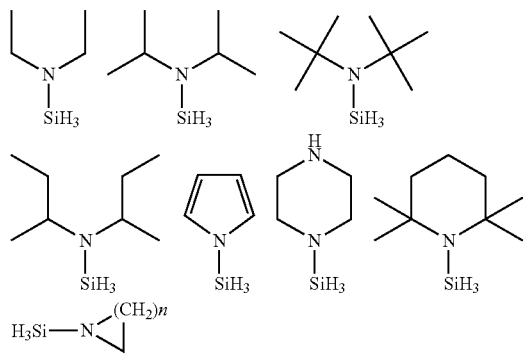

where n is 1-6, preferably 4 or 5.

In some embodiments the silicon precursor is an organoaminosilane which has two silyl groups pendant from a single nitrogen atom as represented by formula B.

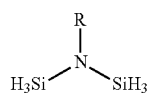

B

As with the R groups of the Class A compounds, R is selected from the group consisting of C$_2$-C$_{10}$ alkyl groups, linear, branched, or cyclic, saturated or unsaturated, aromatic, alkylamino groups, and heterocyclic. Specific R groups include methyl, ethyl, propyl, allyl, butyl, dimethylamine group, and cyclic groups such as cyclopropyl, cyclopentyl, and cyclohexyl. Illustrative compounds are represented by the formulas:

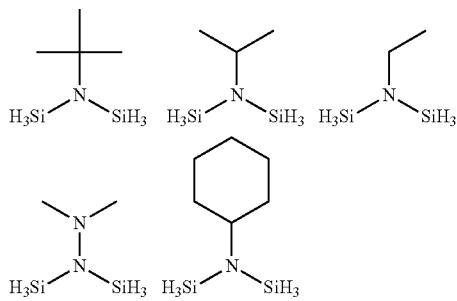

It has been found though that even though the above organoaminosilanes are suitable for producing silicon oxide films on a first surface of a substrate, organoaminosilanes of formula A are preferred.

In some embodiments the silicon precursor can be formed during the ALD type deposition process. In some embodiments a new vapor phase silicon precursor is formed which is then also able to adsorb onto a first surface of the substrate. This can be referred to as in situ formation of silicon precursors In some embodiments in situ formed silicon precursors can be a silane compound, for example with the formula SiL$_1$L$_2$L$_3$L$_4$, wherein L$_1$ represents an amino group, such as an alkyl amino group and L$_2$-L$_4$ represent alkyl or alkoxy group. This silane compound is formed, for example when the first surface of a substrate is contacted with hexa-alkyldisilazane at 350-450° C. at a pressure of 0.1-50 mbar.

Second Reactants

In some embodiments a second reactant as previously disclosed for use in a GeO$_2$ selective deposition process can be used with the above mentioned Si precursors. In some embodiments the second reactant is ozone. In some embodiments the second reactant is molecular oxygen. In some embodiments the second reactant is one or more of the following compounds:

oxides of nitrogen, such as N$_2$O, NO and NO$_2$;

oxyhalide compounds, for example chlorodioxide (ClO$_2$) and perchloroacid (HClO$_4$);

peracids, for example perbenzoic acid and peracetic acid;

alcohols, such as methanol and ethanol;

various radicals, for example oxygen radicals (O) or hydroxyl radical (OH); and hydrogen peroxide (H$_2$O$_2$).

In some embodiments the oxygen precursor is not plasma. In some embodiments the oxygen precursor comprises oxygen radicals. As discussed above, in some embodiments the selective deposition processes disclosed herein do not utilize plasma, such as direct plasma as the direct plasma can harm the second surface of the substrate. In some instances, however, a selective deposition process could utilize radicals made by plasma as a reactant which are not too energetic, for example oxygen radicals made by plasma that do not destroy or degrade a surface of the substrate.

According to some embodiments, at least one compound or the at least one oxygen containing gas is on the first surface of the substrate prior to contacting the surface with another compound and/or at least one oxygen containing gas.

In some embodiments, contacting the substrate surface with each compound and/or oxygen containing gas is followed by the removal of the compound and/or oxygen containing gas from the surface of the substrate, for example by injection of a purge gas, such as an inert gas, into a reaction chamber, while in some embodiments contacting the surface of the substrate with compounds and/or gas is repeated until the desired $SiO_2$ film thickness is obtained. The pressure inside a reaction chamber shall be preferably below 100 Torr, more preferably below 2 Torr. Preferably, the H content in the selectively deposited SiO2 film is less than $8.10^{21}$ atoms/cc.

In some embodiments, an ozone containing gas is a gas mixture comprising oxygen and ozone with a ratio $O_3/O_2$ below 30% vol., preferably between 5% and 20% vol. Preferably, the oxygen/ozone gas mixture is diluted into an inert gas, preferably nitrogen.

Selective Deposition of MgO on Dielectric

MgO may be deposited by an atomic layer deposition type process on a first dielectric surface of a substrate relative to a second surface of the same substrate. In some embodiments the dielectric surface is a hydrophilic OH-terminated surface. For example, the dielectric surface can be a $SiO_2$, low-k or $GeO_2$ surface. In some embodiments the second surface may be a conductive surface, a metal surface, or a H-terminated surface. The second surface may be, for example, a Cu, Ru, Al, Ni, Co, or other noble metal surface. In some embodiments the second surface comprises a metal selected individually from Cu, Ni, Co, Al, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. As discussed above, in some embodiments a dielectric surface may be treated to increase the amount of OH-groups on the surface.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

In some embodiments MgO deposition on the first surface of the substrate relative to the second surface of the substrate is at least about 90% selective, at least about 95% selective, at least about 96%, 97%, 98% or 99% or greater selective. In some embodiments MgO deposition only occurs on the first surface and does not occur on the second surface. In some embodiments MgO deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the MgO is selectively deposited by an ALD type process using, for example, $Mg(Cp)_2$ as a magnesium reactant and water, ozone or a combination of water and ozone as an oxygen reactant. In some embodiments MgO is selectively deposited by an ALD type process using, for example, $Mg(thd)_2$ as a Mg reactant and water, ozone, or a combination of water and ozone as an oxygen reactant. Methods for depositing MgO by ALD are known in the art and can be adapted to selectively deposit MgO on a dielectric surface relative to a metal surface.

In some embodiments the MgO is deposited by a method as described in Putkonen et al. Enhanced Growth Rate in Atomic Layer Epitaxy Deposition of Magnesium Oxide Thin Films. J. Mater. Chem., 2000. 10:1857-1861, which is hereby incorporated by reference.

As previously discussed, in some embodiments the metal surface may be treated to facilitate selective deposition of MgO on the dielectric surface relative to the metal surface. In some embodiments, the metal surface is oxidized prior to deposition in order to facilitate selective deposition of MgO on the dielectric surface relative to the metal surface. In particular in some embodiments a metal surface is oxidized and MgO is deposited from a magnesium precursor, such as $Mg(Cp)_2$, and water. In some embodiments the water in the MgO deposition process may serve to oxidize the metal surface. Thus, in some embodiments the water is provided first in the initial ALD cycle, or prior to the first ALD cycle.

In some embodiments a metal surface is oxidized and MgO is deposited from a magnesium precursor, such as $Mg(Cp)_2$, and ozone. In some embodiments the ozone in the MgO deposition process may serve to oxidize the metal surface. Thus, in some embodiments ozone is provided first in the initial ALD cycle, or prior to the first ALD cycle.

As previously discussed, in some embodiments the metal surface is passivated prior to deposition in order to facilitate selective deposition of MgO on the dielectric surface relative to the metal surface. For example, the metal surface can be provided with alkylsilyl groups. In particular in some embodiments a metal surface is passivated and MgO is deposited from a magnesium precursor, such as $Mg(Cp)_2$, and water.

Figure 6:
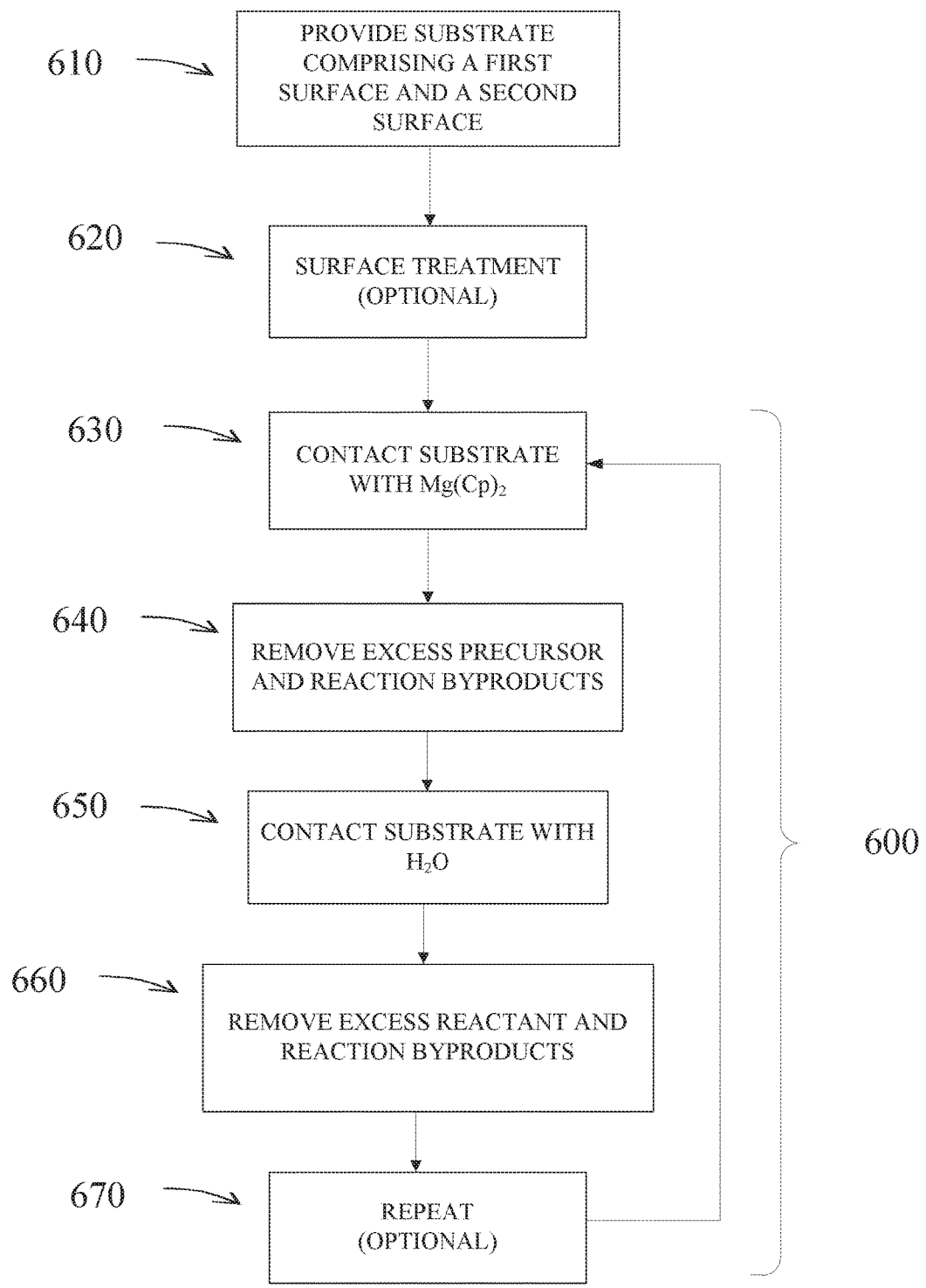
FIG. 6 illustrates a deposition process flow for selectively depositing MgO on a first surface of a substrate relative to a second, different surface of the same substrate.

In some embodiments the MgO is deposited by an ALD type process on a first surface of a substrate. Referring to FIG. 6 and according to a preferred embodiment a substrate comprising a first surface and a second surface is provided at step 610 and a dielectric, here MgO, is selectively deposited on a first surface of a substrate by an ALD-type process comprising multiple cycles, each cycle 600 comprising:

contacting the surface of a substrate with a vaporized first precursor, here $Mg(Cp)_2$, at step 630;

removing excess first precursor and reaction by products, if any, from the surface at step 640;

contacting the surface of the substrate with a second vaporized reactant, here $H_2O$, at step 650 removing from the surface, at step 660, excess second reactant and any gaseous by-products formed in the reaction between the first precursor layer on the first surface of the substrate and the second reactant, and;

repeating, at step 670, the contacting and removing steps until a dielectric, here MgO, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process 600. In FIG. 6 this is indicated by step 620 in which the second, metal surface is deactivated, such as by passivation or oxidation prior to the deposition of the dielectric, here MgO.

In some embodiments a carrier gas is used in the ALD type deposition process, as described above. In some embodiments Mg precursor is transported into a reaction space by a $N_2$ carrier gas. In some embodiments the $N_2$ carrier gas flows at a rate of 60 sccm.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments Mg precursor is heated to 50° C. and transported through heated lines into a reaction space. In some embodiments water vapor is generated in a cylinder kept at 30° C. without the using of an additional bubbling system. In some embodiments $Mg(Cp)_2$ is used as a Mg reactant and water, ozone or a combination of water and ozone as an oxygen reactant. In some embodiments the substrate is moved such that different reactants alternately and sequentially contact the surface of the substrate in a desired sequence for a desired time. In some embodiments the substrate is moved from a first reaction chamber to a second, different reaction chamber. In some embodiments the substrate is moved within a first reaction chamber.

Selective Deposition of a Pore Sealing Layer

In some embodiments, a $GeO_2$ layer is selectively deposited as a pore sealing layer on a porous, low-k film relative to a metal surface by a method described herein. In some embodiments, the porous, low-k film and metal surface may be part of a dual damascene structure. In some embodiments a MgO layer is used as the pore sealing layer and may be deposited as described herein.

When fabricating integrated circuits, layers of insulating, conducting and semiconducting materials are deposited and patterned to produce desired structures. "Back end" or metallization processes include contact formation and metal line or wire formation. Contact formation vertically connects conductive layers through an insulating layer. Conventionally, contact vias or openings are formed in the insulating layer, which typically comprises a form of oxide such as borophosphosilicate glass (BPSG) or an oxide formed from tetraethylorthosilicate (TEOS) precursors. The vias are then filled with conductive material, thereby interconnecting electrical devices and wiring above and below the insulating layers. The layers interconnected by vertical contacts typically include horizontal metal lines running across the integrated circuit. Such lines are conventionally formed by depositing a metal layer over the insulating layer, masking the metal layer in a desired wiring pattern, and etching away metal between the desired wires or conductive lines.

Damascene processing involves forming trenches in the pattern of the desired lines, filling or overfilling the trenches with a metal or other conductive material, and then etching the excess metal back to the insulating layer. Wires are thus left within the trenches, isolated from one another in the desired pattern. The etch back process avoids the more difficult photolithographic mask and etching processes of conventional metal line definition.

In an extension of damascene processing, a process known as dual damascene involves forming two insulating layers, typically separated by an etch stop material, and forming trenches in the upper insulating layer, as described above for damascene processing. After the trenches have been etched, a further mask is employed to etch contact vias downwardly through the floor of the trenches and the lower insulating layer to expose lower conductive elements where contacts are desired.

More particularly, in some embodiments selective deposition methods are applied to metallization structures formed in porous "low k" materials. Prior to the highly conformal self-saturating formation of insulation layers noted above, a sealing layer is first selectively deposited over exposed porous surfaces, blocking the pores. The conformal self-saturating processes cannot then penetrate the pores and the low k dielectric maintains its desired properties. The selective nature of the deposition process ensures that the deposited sealing layer does not interfere with the conductive surface at the bottom of the via.

The selective deposition method is selected to block, plug or seal the pores of the porous low k material at the exposed surfaces, without filling the pores to any significant depth into the low k material. Completely filling the pores of the low k material, even with an insulating material, would negate the advantage of the porous low k material by raising the dielectric constant of the material.

The selective nature of the selective deposition processes disclosed herein enables deposition of a pore sealing layer in a dual damascene process without depositing on the conductive floor of the trenches. By selectively depositing only on a first, porous low surface relative to a second, conductive surface on the same substrate there is reduced need to etch downwardly through the floor of the trenches to expose lower conductive elements. In some embodiments no pore sealing layer is deposited on a second, conductive surface of the substrate, thereby eliminating the need for an etch to expose the conductive surface. In some embodiments some amount of pore sealing layer may be deposited on the second, conductive surface of the substrate, however it can be easily removed by, for example, an $H_2$ plasma treatment of the conductive surface without the need for an additional etch step. In some embodiments the conductive surface is treated prior to beginning the deposition process. In some embodiments the conductive surface is treated as the beginning of the deposition process. In some embodiments the treatment of the conductive surface comprises oxidizing the conductive surface. In some embodiments the conductive surface may no longer be conductive after it has been treated. For example, the conductive surface may be treated prior to or at the beginning of the selective deposition process, such as by oxidation, and the treated surface may no longer be conductive.

Figure 7A:
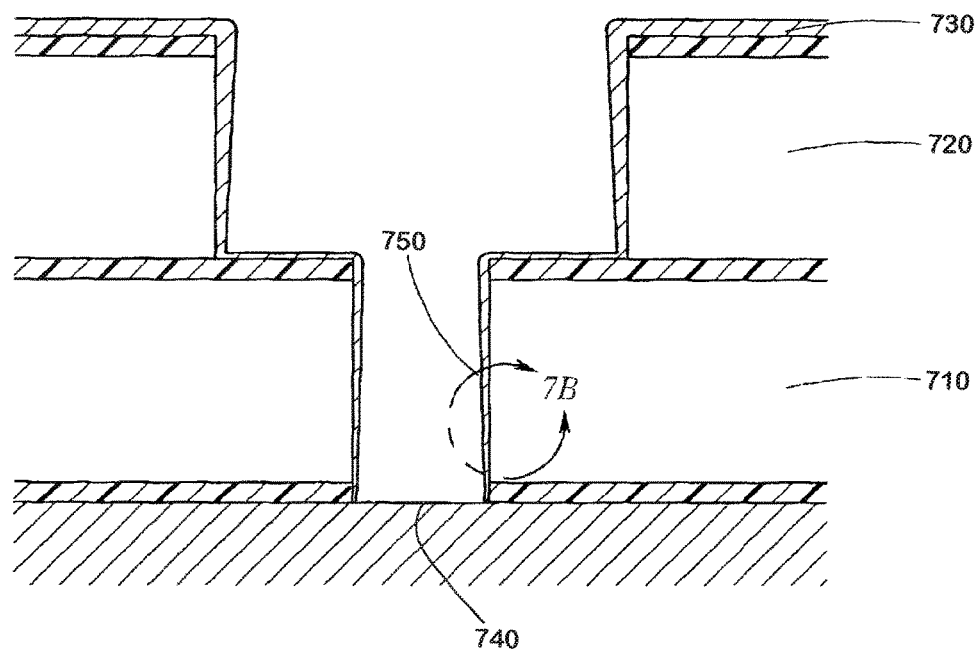
FIG. 7A illustrates a dual damascene structure after selective deposition of a pore sealing layer.

In the illustrated embodiment, blocking is accomplished by lining the opening in the porous low k layers 710, 720 with a sealing layer 730 as shown in FIG. 7A while no deposition occurs on the conductive floor of the trench, 740. More particularly, the sealing layer 730 is deposited in the opening of the porous low k layer by a method that does not have high enough conformality to extensively fill the pores through the thickness of the low k insulators 710, 720. In some embodiments the sealing layer is selectively deposited in the opening of the porous low k layer relative to the conductive material at the bottom of the via 740. Preferably, the selective deposition fills or plugs pores no more than three pore depths into the low k insulator, where the pore depth is defined by average pore size, without depositing on the conductive surfaces of the substrate. More preferably, the selective deposition fails to continuously line pores beyond three pore depths into the low k insulator. Most preferably, the selective deposition fills pores no more than one pore depth into the low k material, continuously lines pores no more than two pore depths into the low k material, and insufficiently lines pores three pore depths into the layer to conduct electricity if the deposited material were conductive.

Figure 7B:
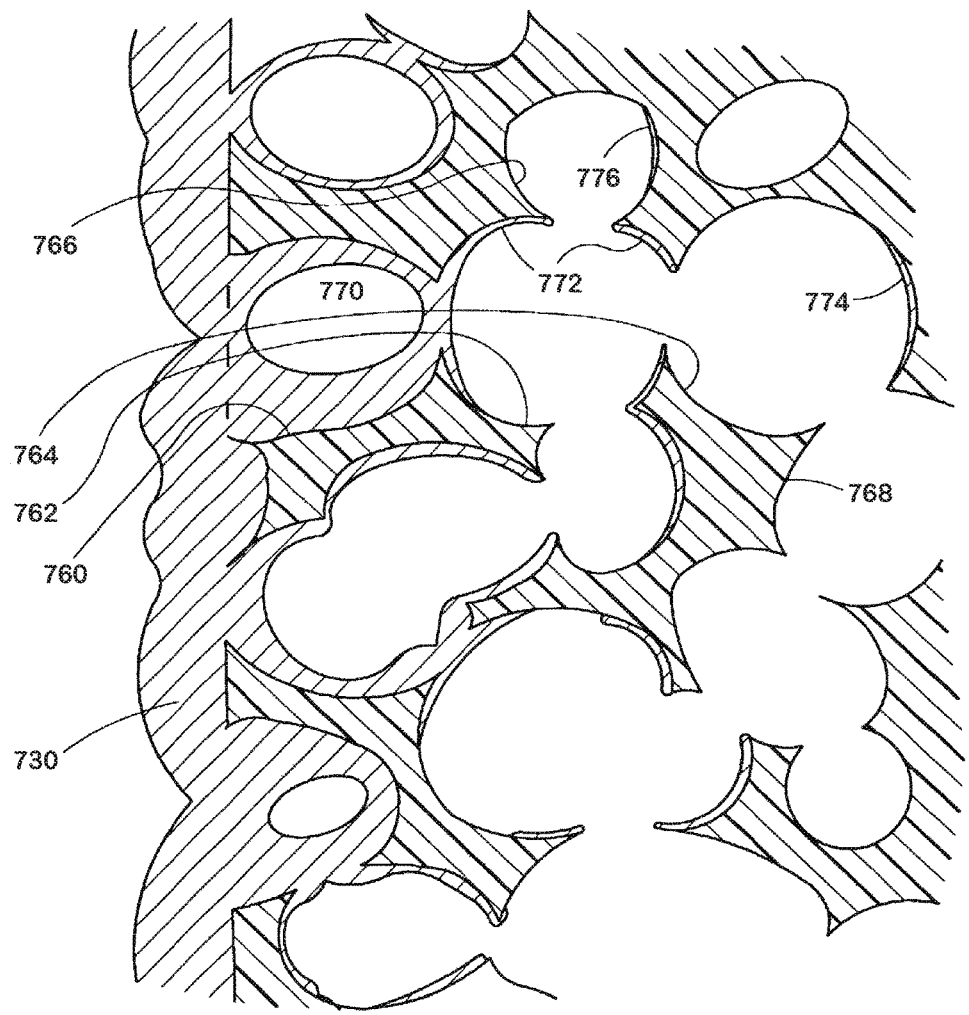
FIG. 7B is an enlarged view of the via sidewall of FIG. 7B shown in cross-section, illustrating that the low k material comprises a plurality of pores within a matrix of insulating material.

As shown in FIG. 7B, none of the pores are completely filled. The first pore 760, open to the via 750 (FIG. 7A), is largely filled with the material of the sealing layer 730. Due to imperfect conformality, however, the sealing layer 730 has pinched off the opening to the first pore 760 before complete filling, leaving a void 770 within the first pore 760. The second pore 762 is shown with a very thin coating 772 of the pore walls that can in some instances be continuous. The third pore 764 has only non-continuous deposits 774, if any. Similarly, a fourth pore 766, which also represents the third pore depth in terms of distance through the pores from the outer (via) surface of the low k material, has only non-continuous deposits 776, if any. In the illustrated embodiment, a fourth pore 768, representing the fourth pore depth from the surface (along different paths), has no appreciable deposits.

In some embodiments the sealing layer 730 is selectively formed on a first porous low k surface of a substrate relative to a second, conductive, surface 740 by an ALD type process as described above. Advantageously, a "low conformality" ALD type process for blocking the pores of the low k material can be followed in situ by high conformality ALD layers, having a minimal, uniform thickness to accomplish the goals of the layers (e.g., adhesion, barrier, electroplating seed layer), thus conserving space for more conductive materials to fill the opening.

In some embodiments the surface of a substrate is alternately and sequentially contacted with the first and second reactants. In some embodiments, the reactants are pulsed into a reaction chamber in an inert carrier gas. In a first step the surface of a substrate is contacted with a Ge source gas, the surface of the substrate is lined with the Ge-containing species. In addition, the Ge source gas is able to penetrate into the porous insulating layer by diffusion. If necessary, the first contacting phase can be lengthened as compared to a subsequent ALD process, ensuring penetration of the metal source gas into the porous insulating layer.

A number of different Ge precursors can be used in the selective pore sealing layer deposition process described herein. Ge precurors as described above for use in GeO$_2$ selective deposition processes can be used in a selective pore sealing layer deposition process. For example, Ge precursors of the formula (1) through (9) as described above can be used in the selective pore sealing layer deposition process. As mentioned above, in some embodiments the Ge precursor is Ge(OEt)4 or TDMAGe. In some embodiments, the Ge precursor is Ge(OMe)$_4$. In some embodiments the Ge-precursor is not a halide. In some embodiments the Ge-precursor may comprise a halogen in at least one ligand, but not in all ligands. Preferably the Ge precursor is Ge alkylamide.

Following the first contacting phase, the Ge source gas is removed from the surface of the substrate, for example, by being purged from the reaction chamber with a pulse of inert gas. In some embodiments of the invention, the removal step is insufficient to remove all of the metal source gas from the pores and some remains trapped in the pores of the insulating material. The duration of the removal step may be equivalent to that of an ALD process that is optimized to purge reactants from the trenches and vias, but not optimized to purge out the pores. Alternately, the removal step may be shortened to ensure that metal source gas remains within the pores of the insulating material.

The surface of a substrate is contacted with a second reactant following the removal of the first reactant. Preferably the second reactant is an oxygen source gas. A number of different oxygen sources can be utilized, as outlined above with respect to selective deposition of GeO$_2$. Preferably the second reactant is H$_2$O. The second reactant may be an oxygen-containing gas pulse and can be a mixture of oxygen and inactive gas, such as nitrogen or argon. In some embodiments the second reactant may be a molecular oxygen-containing gas pulse. The preferred oxygen content of the oxygen-source gas is from about 10% to about 25%. Thus, one source of oxygen may be air. In some embodiments, the second reactant is molecular oxygen. In some embodiments, the second reactant comprises an activated or excited oxygen species. In some embodiments, the second reactant comprises ozone. The second reactant may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the second reactant is oxygen plasma.

The second reactant reacts with the monolayer of Ge-containing species selectively adsorbed on the surface of the porous low k material. Additionally, the second reactant diffuses into the insulating material where it reacts with the Ge source gas that remains within the pores. This is a CVD-type reaction, leading to deposition of much more than one monolayer of GeO$_2$ within the pores. The second reactant will react with the first Ge source gas it encounters and thus its diffusion into the pores will be limited, leading to a depletion effect into the insulating layer. The result of the depletion effect will be the deposition of the most GeO$_2$ at the neck of the first pore, with GeO$_2$ deposition decreasing with distance into the insulating material. This will narrow the neck of the first pore, further limiting diffusion into the porous insulating material during subsequent ALD cycles. Thus, the alternating process operates in a selective ALD mode in relatively accessible regions, and in a CVD mode with attending depletion effects in relatively more confined regions, such as the pores. From FIGS. 7A and 7B, it will be clear that top surface regions of the first low k material are the most accessible regions, a trench or sidewall region of the low k material has a reduced accessibility, the accessibility decreasing with increasing distance to the top surface, and pore regions have the lowest accessibility. The process can be more generally applied whenever such differences in accessibility exist.

Repetition of the ALD cycle will narrow the neck of the first pore further by increasing the thickness of the deposited layer and will eventually lead to a continuous, sealing layer blocking off the pores. The combination of the CVD depletion effect and the resulting decrease in diffusion into the pores, will allow this process to seal the porous insulating material without reducing the insulating properties of the material. The number of repetitions needed to seal off the pores will depend on the pore size and can be determined by the skilled artisan through routine experimentation.

As will be appreciated by the skilled artisan in view of the above disclosure, this alternating deposition process can be optimized, by proper selection of reactant contact duration and separation (e.g., removal step duration) for a desired level of conformality. This "low conformality" modification advantageously achieves a conformality along a continuum between the near perfectly conformal coverage of a pure ALD process (wherein reactant contacting is self-saturating and well separated from one another to avoid CVD reactions) and the relatively poor conformality of a pure CVD process (wherein deposition rates are strongly influenced by temperature and/or reactant concentration). Advantageously, the skilled artisan can readily tailor the conformality suitable for a given geometry and a given purpose for a nonconformal layer through routine experimentation with varied reactant contact step durations and separations. It will be appreciated, in view of the disclosure herein, that selection of contact step durations and separations can involve one or more of the deposition phases in each cycle, and that that each cycle can include two, three or more reactant contacting steps.

Sealing of porous, low-k films is described in U.S. Pat. No. 6,759,325, which is incorporated by reference herein. In particular, pore structure is described and various mechanisms for plugging the pores, such as by deposition processes, that can be modified to utilize the selective $GeO_2$ deposition processes described herein. For example, ALD processes can be modified to provide some overlap and thus provide some gas phase interactions. In addition, some CVD-like reactions may occur in pores due to residual reactant that is not removed between provision of reactants.

In some embodiments the $GeO_2$ pore sealing layer is deposited on the low-k film without depositing significant amounts of $GeO_2$ on a metal surface, such as a Cu or CuO or oxygen terminated Cu surface, on the bottom of the via. In some embodiments $GeO_2$ deposition is 90, 95, 95, 97, 98, 99% or more selective for the low-k film relative to the metal surface. In some embodiments, no $GeO_2$ is formed on the metal surface. In some embodiments the metal surface remains conductive.

In some embodiments the pore sealing layer is deposited on porous low-k film without significantly altering the low-k nature of the film. For example, the pore sealing layer may be deposited without significantly increasing the effective k-value.

In some embodiments the porous low-k film may be treated to enhance precursor adsorption, such as by treatment with N-containing plasma, N radicals or N atoms.

In some embodiments the sealing layer seals pores of about 3 nm diameter. In some embodiments the sealing layer seals pores of about 3 nm or less diameter. In some embodiments the pore sealing layer is a thin $GeO_2$ layer, for example about 5 nm or less, about 3 nm or less, about 2 nm or less, or even about 1 nm or less.

In some embodiments the pore sealing layer may provide reactive sites, such as OH, for subsequent deposition of a Cu barrier layer by ALD.

Repairing Damaged Dielectric Films and Subsequent Selective Deposition of a Pore Sealing Layer in a Dual Damascene Structure Some embodiments of the present invention provide a method for repairing process-related damage of a dielectric film formed on a substrate caused by processing the dielectric film, wherein the dielectric film has a first dielectric constant before the processing, and the damaged dielectric film has a second dielectric constant which is higher than the first dielectric constant, comprising:

(i) adsorbing a first restoration gas containing silicon on a surface of the damaged dielectric film by exposing the surface to the first gas to restore the surface with the first gas without depositing a film in the absence of reactive species, wherein the surface-restored dielectric film has a third dielectric constant which is lower than the second dielectric constant;

(ii) treating the surface with $N_2$ plasma, and optionally $H_2O$, and selectively adsorbing a second gas containing Ge on a plasma treated porous low k surface of the surface-restored dielectric film by exposing the surface to the second gas, followed by applying a second reactant to the second gas-adsorbed surface of the dielectric film, to form a monolayer of $GeO_2$ thereon, wherein the duration of exposing the surface to the first gas in step (i) is longer than the duration of exposing the surface to the second gas in step (ii); and (iii) repeating step (ii) to selectively deposit monolayer $GeO_2$ to cover the surface of the surface-restored dielectric film.

In some embodiments, step (i) corresponds to a restoration step of a porous surface damaged during processes, wherein the first gas is adsorbed on the porous surface. Typically, the damage occurs inside the porous dielectric film, and the first gas (which may be referred to as a "restoration gas") is required to be diffused and adsorbed through pores having a size on the nanometer order. Since the porous surface has a large surface area and has a low conductance, it takes more time for the gas to reach all the surfaces and be saturated thereon than in the case where the gas is adsorbed on a flat surface. Since this process is a self-limiting adsorption reaction process, the number of deposited gas molecules is determined by the number of reactive surface sites (i.e., damaged surfaces having OH groups) and is independent of the gas exposure after saturation, and a supply of the gas is such that the reactive surface sites are saturated thereby, and a self-assembling monolayer is formed. In some embodiments, the duration of exposure of the damaged surface to the first gas (the duration of gas supply) can be determined by the degree of damage (e.g., an increase of dielectric constant by 0.1, 0.2, 0.3, 0.4 as compared with the dielectric constant of the dielectric film prior to the damage), porosity of the film (e.g., in a range of about 10% to about 60%), flow rate of the first gas (e.g., in a range of about 0.5 sccm to about 20 sccm), etc., based on routine experimentations. Typically, the duration of exposure of the damaged surface to the first gas may be about 2 seconds to about 120 seconds (e.g., including about 3, 5, 10, 20, 40, 80, and values between any two numbers of the foregoing, typically about 5 seconds or longer).

In some embodiments the restored porous low k surface is then treated by way of exposure to a reactive species. Reactive species are species generated from a reactant gas by a plasma or other energy. In some embodiments, the reactant gas may be selected from the group consisting of He, Ar, $NH_3$, $H_2$, and $N_2$. Preferably, the reactant gas is $N_2$, and the reactive species consist of a nitrogen plasma. In some embodiments the reactive species comprises $N_2$ plasma. In some embodiments the porous low k surface is treated with reactive species so that the subsequently applied Ge precursor can coordinate with the plasma treated porous low k surface.

In some embodiments the restored porous low k surface is treated with $H_2O$ after exposure to reactive species in order to form Si—OH sites on the porous low k surface for subsequent $GeO_2$ growth.

In some embodiments a $GeO_2$ sealing layer is selectively deposited by a an ALD type process, as described above, on the porous low k surface relative to a second surface of the substrate.

In certain preferred embodiments $GeO_2$ is selectively deposited on a porous low k surface of a substrate relative to a second, different surface of the substrate by an ALD type process, comprising multiple cycles, each cycle comprising alternately and sequentially contacting the substrate with vapor phase Ge— alkylamide and a second reactant comprising water. In some embodiments Ge alkylamide is provided as a Ge precursor and is reacted with the first, low k surface. In some embodiments $H_2O$ is then provided as a second reactant to react with the selectively adsorbed Ge precursor to selectively deposit $GeO_2$.

In some embodiments MgO is selectively deposited as the pore sealing layer according to the process for MgO selective deposition discussed above. In some embodiment MgO is deposited from $MgCp_2$ and water vapor, as $MgCp_2$ is believed to be non-reactive toward the CuO surface and it reacts with water vapor.

In certain preferred embodiments MgO is selectively deposited on a first surface of a substrate relative to a second, different surface of the substrate by an ALD type process, comprising multiple cycles, each cycle comprising alternately and sequentially contacting the substrate with vapor phase $Mg(Cp)_2$ and a second reactant comprising water.

In some embodiments the second surface is Cu. In some embodiments the second surface is CuO. In some embodiments the second, Cu, surface is purposefully oxidized with an oxygen source to form a CuO surface. In some embodiments the second, Cu, surface has oxidized in the ambient air and/or contains native oxide. In some embodiments the second, Cu, surface contains an oxide which has been deposited.

As previously discussed, in some embodiments, the Cu surface is oxidized prior to deposition in order to facilitate selective deposition of $GeO_2$ on the dielectric surface relative to the Cu surface. In some embodiments a second reactant in a selective deposition process may serve to oxidize the Cu surface. Thus, in some embodiments the second reactant is provided first in the initial ALD cycle, or prior to the first ALD cycle. In some embodiments the Cu surface is oxidized prior to beginning the selective deposition process.

In some embodiments, during the process flow the Cu surface is kept oxidized as a CuO surface. In some embodiments, after the preferred number of deposition cycles have completed the CuO surface can be reduced with $H_2$ plasma and a Cu barrier can be deposited. In some embodiments, a CuO surface can be reduced with an organic reducing agent such as HCOOH, methanol or ethanol or with molecular hydrogen $H_2$ or with hydrogen containing radicals or hydrogen atoms.

Advantageously, a $GeO_2$ pore sealing layer, as described herein can provide good reactive sites (Ge—OH) for instance for ALD barrier deposition. Additionally, since $GeO_2$ is selectively deposited using water as the second reactant, no further damage to the low-k surface is done.

The above described ALD type selective deposition process provides conformal growth of the $GeO_2$ layer, in case the treatment, such as treatment comprising plasma or radicals, can form the reactive sites also on the sidewalls. $GeO_2$ can also provide good reactive sites, in the form of Ge—OH surface terminations, for subsequent ALD barrier layer deposition. In some embodiments the $GeO_2$ sealing layer can act as a barrier layer.

In some embodiments a $GeO_2$ pore sealing layer may be selectively deposited on a substrate surface comprising a first, dielectric surface relative to a second, Cu surface. The dielectric surface may be a porous low-k surface, such as a silicon oxide based porous low-k surface. In some embodiments the Cu surface may be oxidized prior to the beginning of the selective deposition process and may be kept oxidized throughout the process. In some embodiments $GeO_2$ may be selectively deposited from an ALD type process such as a process shown in FIG. 4 comprising multiple $GeO_2$ deposition cycles, each cycle comprising alternately and sequentially contacting the substrate with vapor phase TDMAGe and a second reactant comprising water.

In some embodiments the $GeO_2$ selective deposition process can be carried out at a deposition temperature of 175° C. In some embodiments the first contacting step can comprise introducing a vapor phase pulse of TDMAGe into a reaction chamber. In some embodiments the pulse time is about 3 seconds. In some embodiments the removal step may be a purge step. Purging means that vapor phase precursors and/or vapor phase byproducts are removed from the substrate surface such as by evacuating a chamber with a vacuum pump and/or by replacing the gas inside a reactor with an inert gas such as argon or nitrogen. In some embodiments the first removal step can have a purge time of about 6 seconds. In some embodiments the second contacting step comprises contacting the substrate with $H_2O$. In some embodiments the second contacting step comprises providing a vapor phase pulse of $H_2O$ into a reaction chamber. In some embodiments the pulse time is about 3 seconds. In some embodiments the second removal step can be a purge step similar to the first removal step. In some embodiments the second removal step has a purge time of about 6 seconds.

Example

The selective growth of the $GeO_2$ pore sealing layer is based, in part, on the lack of growth of $GeO_2$ deposited from Ge alkylamide and $H_2O$ on CuO (see Table 1, below, for LEIS results). No $GeO2$ was found on the CuO surface even after 20 $GeO_2$ deposition cycles of Ge alkylamide and $H_2O$.

TABLE 1

| | Peak areas for Cu, Ge, N, and Co/Ni | | | | | |
|---|---|---|---|---|---|---|
| | Cu | | Ge | | N | Co/Ni |
| Cycles | 3 keV$^4$He$^+$ | 5 keV$^{20}$Ne$^+$ | 3 keV$^4$He$^+$ | 5 keV$^{20}$Ne$^+$ | 3 keV$^4$He$^+$ | 5 keV$^{20}$Ne$^+$ |
| 0 | 1849 | 12203 | 0 | 0 | 31 | 774 |
| 1 | 1554 | 8959 | 0 | 0 | 68 | 743 |
| 2 | 1735 | 10172 | 0 | 0 | 66 | 729 |

TABLE 1-continued

| | Peak areas for Cu, Ge, N, and Co/Ni | | | | | |
|---|---|---|---|---|---|---|
| | Cu | | Ge | | N | Co/Ni |
| Cycles | 3 keV $^4$He$^+$ | 5 keV $^{20}$Ne$^+$ | 3 keV $^4$He$^+$ | 5 keV $^{20}$Ne$^+$ | 3 keV $^4$He$^+$ | 5 keV $^{20}$Ne$^+$ |
| 5 | 1946 | 13902 | 0 | 0 | 61 | 875 |
| 10 | 1412 | 10574 | 0 | 0 | 33 | 812 |
| 20 | 1418 | 11414 | 0 | 0 | 73 | 786 |
| 50 | 1535 | 6425 | 607 | 3758 | 23 | 312 |
| 250 | 0 | 0 | 1016 | 7203 | 0 | 0 |

Even if some GeO$_2$ was deposited on the CuO surface, it most likely can be removed, since germanium oxide, and especially Ge(II)O is not stable on metal surfaces and can be removed during a H$_2$ plasma treatment of the CuO surface.

We claim:

1. A method for selectively depositing a dielectric material on a dielectric surface of a substrate relative to a metal surface of the same substrate, the method comprising:
    at least one deposition cycle comprising alternately and sequentially contacting the substrate with a precursor and a reactant, and
    wherein the metal surface is treated to inhibit deposition of the dielectric material thereon prior to the at least one deposition cycle, and
    wherein the dielectric material is selectively deposited on the dielectric surface relative to the metal surface with a selectivity of at least 80%.

2. The method of claim 1, wherein the precursor comprises an aminosilane precursor and the reactant comprises ozone.

3. The method of claim 1, wherein the precursor comprises Ge, Sb, Si or Mg.

4. The method of claim 3, wherein the precursor comprises a Ge-alkylamine and the reactant is water.

5. The method of claim 3, wherein the precursor comprises Mg(Cp)$_2$ and the reactant is selected from water, ozone and a combination of water and ozone.

6. The method of claim 1, wherein the dielectric material is selected from GeO$_2$, SiO$_2$ and MgO.

7. The method of claim 1, wherein the dielectric surface comprises a low-k surface.

8. The method of claim 1, wherein the metal surface comprises Cu.

9. The method of claim 1, wherein the metal surface is oxidized prior to the at least one deposition cycle.

10. The method of claim 1, wherein the dielectric material is selectively deposited on the dielectric surface relative to the metal surface with a selectivity of at least 90%.

11. The method of claim 1, wherein the selectivity is retained for up to 20 deposition cycles.

12. A method for selectively depositing a metal on a first metal surface of a substrate relative to a second, different surface of the same substrate, the method comprising:
    treating the second surface to provide OH, NH$_x$, or SH$_x$ terminations; and
    subsequently carrying out at least one deposition cycle comprising alternately and sequentially contacting the substrate with a metal precursor and a reactant,
    wherein the metal is selectively deposited on the first surface relative to the second, different surface with a selectivity of at least 80%.

13. The method of claim 12, wherein the metal is selected from Sb and Ge.

14. The method of claim 12, wherein the first metal surface comprises Ni, Co, Cu, Al or Ru.

15. The method of claim 12, wherein the second surface is a dielectric surface.

16. The method of claim 12, wherein the metal precursor comprises a Sb reactant having the formula SbX$_3$, where X is a halogen.

17. A method for selectively depositing a metal or metal oxide material on a first dielectric surface of a substrate relative to a second, different surface of the same substrate, the method comprising:
    at least one deposition cycle comprising alternately and sequentially contacting the substrate with a precursor comprising a metal and a reactant, and
    wherein the second different surface is treated to inhibit deposition of the metal or metal oxide material thereon prior to the at least one deposition cycle, and
    wherein the metal or metal oxide material is selectively deposited on the first dielectric surface relative to the second, different surface with a selectivity of at least 90%.

18. The method of claim 17, wherein the precursor comprises Ni, Fe or Co.

19. The method of claim 17, wherein the metal or metal oxide is selected from Ni, Fe, Co, Ni oxide, Fe oxide and Co oxide.

20. The method of claim 17, wherein the first dielectric surface comprises SiO$_2$, GeO$_2$ or a low-k surface.

* * * * *

UNITED STATES PATENT AND TRADEMARK OFFICE
CERTIFICATE OF CORRECTION

PATENT NO. : 10,456,808 B2
APPLICATION NO. : 15/877632
DATED : October 29, 2019
INVENTOR(S) : Suvi P. Haukka It is certified that error appears in the above-identified patent and that said Letters Patent is hereby corrected as shown below:

On the Title Page

Column 2 (page 3, item (56)), Line 44, under Other Publications, change "H20"." to --$H_2O$".--.

Column 2 (page 3, item (56)), Line 46, under Other Publications, change ""Si02" to --"$SiO_2$--.

Column 1 (page 4, item (56)), Line 12, under Other Publications, change "Ti02" to --$TiO_2$--.

Column 1 (page 4, item (56)), Line 33, under Other Publications, change "Layor" to --Layer--.

Column 1 (page 4, item (56)), Line 37, under Other Publications, change "opitimization" to --optimization--.

Column 2 (page 4, item (56)), Line 55, under Other Publications, change "Ta205" to --$Ta_2O_5$--.

In the Drawings

Sheet 3, Figure 3, change reference numeral "270" to --370--.

In the Specification

Column 1, Line 3, below "DIELECTRICS" insert --CROSS-REFERENCE TO RELATED APPLICATIONS-- as a new heading.

Column 4, Line 42-43, change "25 C and 40 C." to --25° C and 40° C.--.

Column 8, Line 62, change "contacting" to --Contacting--.

Column 10, Line 55, change "—NH," to -- —$NH_x$--.

Signed and Sealed this
Twenty-fifth Day of February, 2020

Andrei Iancu
*Director of the United States Patent and Trademark Office*

CERTIFICATE OF CORRECTION (continued)
U.S. Pat. No. 10,456,808 B2

Column 10, Line 56, change "—SH," to -- —$SH_x$--.

Column 14, Line 6-7, change "tetraminogermanium" to --tetraaminogermanium--.

Column 15, Line 9 (approx.), after "etc" insert --.--.

Column 16, Line 31, after "etc" insert --.--.

Column 16, Line 37, change "Sb[Al(" to --Sb[A1(--.

Column 19, Line 39, change "contacting" to --Contacting--.

Column 24, Line 65, change "(ii)." to --(II).--.

Column 25, Line 19, change "-nbutylamino-" to -- -n-butylamino- --.

Column 25, Line 23, change "Ni(acac)2,Ni(thd)2" to --Ni(acac)2, Ni(thd)2--.

Column 35, Line 44, change "C1," to --Cl,--.

Column 35, Line 52-53 (approx.), change ")$_3$(AMTES)" to --)$_3$ (AMTES)--.

Column 35, Line 54 (approx.), change ")$_3$(AMTMS)" to --)$_3$ (AMTMS)--.

Column 35, Line 55 (approx.), change ")$_3$(HMDS)." to --)$_3$ (HMDS).--.

Column 36, Line 20 (approx.), change "Formula (II)" to --Formula (III)--.

Column 36, Line 56, change "chains.[0275]" to --chains.--.

Column 40, Line 58, after "650" insert --;--.

Column 40, Line 58-62, delete "removing from the surface, at step 660, excess second reactant and any gaseous by-products formed in the reaction between the first precursor layer on the first surface of the substrate and the second reactant, and;" and insert the same on Column 40, Line 59 as a new paragraph.

Column 43, Line 56, change "precurors" to --precursors--.

Column 45, Line 26, change "that that" to --that--.

Column 47, Line 9, after "by" delete "a".